United States Patent   (10) Patent No.: US 12,356,843 B2
Kim et al.              (45) Date of Patent:     Jul. 8, 2025

(54) DISPLAY APPARATUS

(71) Applicant: SAMSUNG DISPLAY CO., LTD., Yongin-si (KR)

(72) Inventors: Jinho Kim, Yongin-si (KR); Namhyoung Kim, Yongin-si (KR); Jiyong Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/739,262

(22) Filed: Jun. 10, 2024

(65) Prior Publication Data

US 2024/0334800 A1    Oct. 3, 2024

Related U.S. Application Data

(63) Continuation of application No. 18/310,404, filed on May 1, 2023, now Pat. No. 12,010,901.

(30) Foreign Application Priority Data

Aug. 30, 2022  (KR) .................. 10-2022-0109267

(51) Int. Cl.
 *G09G 3/00*  (2006.01)
 *G06F 3/041*  (2006.01)
 (Continued)

(52) U.S. Cl.
 CPC ........... *H10K 59/88* (2023.02); *G06F 3/0412* (2013.01); *G06F 3/04164* (2019.05); *G06F 3/0446* (2019.05); *G09G 3/006* (2013.01); *G09G 3/3233* (2013.01); *H10K 59/131* (2023.02); *H10K 59/40* (2023.02); *G09G 2300/0819* (2013.01);
 (Continued)

(58) Field of Classification Search
 CPC .............................. G09G 3/006; G02F 1/1309
 See application file for complete search history.

(56) References Cited

U.S. PATENT DOCUMENTS 9,262,953 B2   2/2016  Jeong et al.
9,293,425 B2   3/2016  Lee et al.
(Continued)

FOREIGN PATENT DOCUMENTS

KR       10-0909417 B1    7/2009
KR    10-2020-0017019 A    2/2020
(Continued)

*Primary Examiner* — Kevin M Nguyen
(74) *Attorney, Agent, or Firm* — Womble Bond Dickinson (US) LLP

(57) ABSTRACT

A display apparatus may include a substrate including a display area and a peripheral area, pixel circuits in the display area, data lines in the display area and connected to the pixel circuits, first circuit driving signal lines in the peripheral area, and configured to transmit a first circuit driving signal to drive the pixel circuits, a data test pad portion at the peripheral area, and including data test pads connected to the data lines, a pad portion on the peripheral area, and including first circuit pads connected to the first circuit driving signal lines, a first test pad portion at the peripheral area, and including first circuit test pads connected to the first circuit pads, and a second test pad portion at the peripheral area, and including second circuit test pads connected to the first circuit test pads.

7 Claims, 9 Drawing Sheets

(51) Int. Cl.
*G06F 3/044* (2006.01)
*G09G 3/3233* (2016.01)
*H10K 59/131* (2023.01)
*H10K 59/40* (2023.01)
*H10K 59/88* (2023.01)

(52) U.S. Cl.
CPC ............... *G09G 2300/0842* (2013.01); *G09G 2300/0861* (2013.01); *G09G 2330/12* (2013.01); *G09G 2354/00* (2013.01)

(56) References Cited

U.S. PATENT DOCUMENTS

| | | | |
|---|---|---|---|
| 10,845,662 | B2 | 11/2020 | Park et al. |
| 12,010,901 | B2 * | 6/2024 | Kim ..................... G06F 3/0446 |
| 2005/0057273 | A1 | 3/2005 | Lin et al. |

FOREIGN PATENT DOCUMENTS

| | | |
|---|---|---|
| KR | 10-2172899 B1 | 11/2020 |
| KR | 10-2181165 B1 | 11/2020 |
| KR | 10-2231898 B1 | 3/2021 |

* cited by examiner

DISPLAY APPARATUS

CROSS-REFERENCE TO RELATED APPLICATIONS

The application is a continuation of U.S. patent application Ser. No. 18/310,404, filed May 1, 2023, now U.S. Pat. No. 12,010,901, which claims priority to and the benefit of Korean Patent Application No. 10-2022-0109267, filed Aug. 30, 2022, the entire content of both of which is incorporated herein by reference.

BACKGROUND

1. Field

Aspects of one or more embodiments relate to a display apparatus.

2. Description of the Related Art

Display apparatuses visually display data. Display apparatuses may be used as displays for small-sized products, such as mobile phones and the like, or as displays for large-sized products, such as televisions and the like.

Such a display apparatus includes a substrate that may be divided into a display area and a non-display area, and gate lines and data lines are formed in the display area and are insulated from each other. A plurality of pixel regions may be defined in the display area, and pixels respectively located in the plurality of pixel regions receive electrical signals from the gate line and the data line intersecting each other and emit light, thereby displaying an image to the outside. A thin-film transistor and a pixel electrode electrically connected to the thin-film transistor are provided in each of the pixel regions, and a counter electrode is commonly provided over the pixel regions. Various wires for transmitting electrical signals to the pixels in the display area, a gate driver, and pads to which a data driver and a controller may be connected may be provided in the non-display area.

Recently, as the uses of display apparatuses has become more diversified, various designs to improve the quality of display apparatuses have been attempted.

The above information disclosed in this Background section is only for enhancement of understanding of the background and therefore the information discussed in this Background section does not necessarily constitute prior art.

SUMMARY

One or more embodiments provide a display apparatus capable of testing pixel circuits for all display areas.

The technical objectives to be achieved by the disclosure are not limited to the above-described objectives, and other technical objectives that are not mentioned herein would be clearly understood by a person skilled in the art from the description of the disclosure.

Additional aspects will be set forth in part in the description which follows and, in part, will be apparent from the description, or may be learned by practice of the presented embodiments.

According to one or more embodiments, a display apparatus includes a substrate including a display area and a peripheral area surrounding at least a portion of the display area, a plurality of pixel circuits arranged in the display area, a plurality of data lines arranged in the display area, extending in a first direction, and electrically connected to the plurality of pixel circuits, a plurality of first circuit driving signal lines arranged in the peripheral area, and configured to transmit a first circuit driving signal to drive the plurality of pixel circuits, a data test pad portion arranged on one side of the peripheral area, and including a plurality of data test pads electrically connected to the plurality of data lines, respectively, a pad portion arranged on the one side of the peripheral area, and including a plurality of first circuit pads electrically connected to the plurality of first circuit driving signal lines, respectively, a first test pad portion arranged on the one side of the peripheral area, and including a plurality of first circuit test pads electrically connected to the plurality of first circuit pads, respectively, and a second test pad portion arranged on the one side of the peripheral area, and including a plurality of second circuit test pads electrically connected to the plurality of first circuit test pads, respectively.

According to some embodiments, a size of each of the plurality of first circuit test pads may be less than a size of each of the plurality of second circuit test pads.

According to some embodiments, a size of each of the plurality of second circuit test pads may be about 10 times to about 15 times a size of each of the plurality of first circuit test pads.

According to some embodiments, a size of each of the plurality of first circuit test pads may be greater than a size of each of the plurality of data test pads.

According to some embodiments, a size of each of the plurality of first circuit test pads may be about 3 times to about 7 times a size of each of the plurality of data test pads.

According to some embodiments, the pad portion, the first test pad portion, and the second test pad portion may be sequentially arranged in the first direction, a first distance between the pad portion and the first test pad portion in the first direction may be less than a second distance between the first test pad portion and the second test pad portion in the first direction.

According to some embodiments, each of the plurality of first circuit pads may have a parallelogrammic planar shape, and each of the plurality of first circuit test pads and the plurality of second circuit test pads may have a rectangular planar shape.

According to some embodiments, the display apparatus may further include a touch sensing layer arranged on the plurality of pixel circuit, and a plurality of touch driving signal lines arranged in the peripheral area, and configured to transmit a touch driving signal configured to drive the touch sensing layer, wherein the pad portion may further include a plurality of touch pads electrically connected to the plurality of touch driving signal lines, respectively, and the second test pad portion may further include a plurality of touch test pads electrically connected to the plurality of touch pads, respectively.

According to some embodiments, the touch sensing layer may include a plurality of first sensing electrode lines extending in the first direction, and a plurality of second sensing electrode lines extending to cross the plurality of first sensing electrode lines, and the plurality of touch driving signal lines may be configured to transmit the touch driving signal to the plurality of first sensing electrode lines and the plurality of second sensing electrode lines.

According to some embodiments, the display apparatus may further include a plurality of first connection lines configured to connect the plurality of first circuit test pads to the plurality of second circuit test pads, respectively, and a plurality of second connection lines configured to connect the plurality of touch pads to the plurality of touch test pads, respectively, wherein the pad portion, the first test pad portion, and the second test pad portion may be sequentially arranged in the first direction, the plurality of first connection lines may radially extend from the first test pad portion, and the plurality of second connection lines may radially extend from the pad portion.

According to some embodiments, the data test pad portion, the pad portion, the first test pad portion, and the second test pad portion may be sequentially arranged in the first direction, the pad portion may at least partially overlap the data test pad portion in the first direction, the first test pad portion may not overlap the data test pad portion in the first direction, and the second test pad portion may at least partially overlap the data test pad portion in the first direction.

According to some embodiments, the display apparatus may further include a printed circuit board attached to the one side of the peripheral area, and including a plurality of terminals electrically connected to the pad portion, and a driving chip mounted on the one side of the peripheral area, and electrically connected to the plurality of data lines.

According to some embodiments, in a plan view, the driving chip may overlap the data test pad portion.

According to some embodiments, the display apparatus may further include a plurality of second circuit driving signal lines arranged in the peripheral area, and configured to transmit a second circuit driving signal configured to drive the plurality of pixel circuits, a third test pad portion arranged on the one side of the peripheral area, and including a plurality of third circuit test pads, and a fourth test pad portion arranged on the one side of the peripheral area, and including a plurality of fourth circuit test pads electrically connected to the plurality of third circuit test pads, respectively, wherein the pad portion may further include a plurality of second circuit pads electrically connected to the plurality of second circuit driving signal lines, respectively, the plurality of third circuit test pads may be electrically connected to the plurality of second circuit pads, respectively, the first test pad portion and the third test pad portion may be symmetrical to each other with respect to the data test pad portion, and the second test pad portion and the fourth test pad portion may be symmetrical to each other with respect to the data test pad portion.

According to some embodiments, a size of each of the plurality of first circuit test pads may be less than a size of each of the plurality of second circuit test pads, the size of each of the plurality of first circuit test pads may be greater than a size of each of the plurality of data test pads, a size of each of the plurality of third circuit test pads may be less than a size of each of the plurality of fourth circuit test pads, and the size of each of the plurality of third circuit test pads may be greater than the size of each of the plurality of data test pads.

According to some embodiments, the display apparatus may further include a plurality of gate lines arranged in the display area, extending in a second direction crossing the first direction, and electrically connected to the plurality of pixel circuits, and a gate driver arranged in the peripheral area, electrically connected to the plurality of gate lines, and configured to transmit a gate signal, wherein the first circuit driving signal may include a control signal forming the gate signal, and a driving voltage and an initialization voltage applied to the plurality of pixel circuits.

According to one or more embodiments, a display apparatus includes a substrate including a display area and a peripheral area surrounding at least a portion of the display area, a plurality of data lines arranged in the display area, extending in a first direction, and electrically connected to the plurality of pixel circuits, a plurality of circuit driving signal lines arranged in the peripheral area, and configured to transmit a circuit driving signal configured to drive the plurality of pixel circuits, a data test pad portion arranged on one side of the peripheral area, and including a plurality of data test pads electrically connected to the plurality of data lines, respectively, a first test pad portion arranged on the one side of the peripheral area, and including a plurality of first circuit test pads electrically connected to the plurality of circuit driving signal lines, respectively, and a second test pad portion arranged on the one side of the peripheral area to be adjacent to the first test pad portion in the first direction, and including a plurality of second circuit test pads electrically connected to the plurality of first circuit test pads, respectively, wherein a size of each of the plurality of first circuit test pads may be less than a size of each of the plurality of second circuit test pads.

According to some embodiments, the size of each of the plurality of first circuit test pads may be greater than a size of each of the plurality of data test pads.

According to some embodiments, the display apparatus may further include a touch sensing layer arranged on the plurality of pixel circuit, and a plurality of touch driving signal lines arranged in the peripheral area, and configured to transmit a touch driving signal configured to drive the touch sensing layer, wherein the second test pad portion may further include a plurality of touch test pads electrically connected to the plurality of touch driving signal lines, respectively.

According to some embodiments, the data test pad portion, the first test pad portion, and the second test pad portion may be sequentially arranged in the first direction, the first test pad portion may not overlap the data test pad portion in the first direction, and the second test pad portion may at least partially overlap the data test pad portion in the first direction.

Other aspects, features, and characteristics of some embodiments of the disclosure will become more apparent from the detailed description, the claims, and the drawings.

These general and specific embodiments may be implemented by using a system, a method, a computer program, or a combination thereof.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
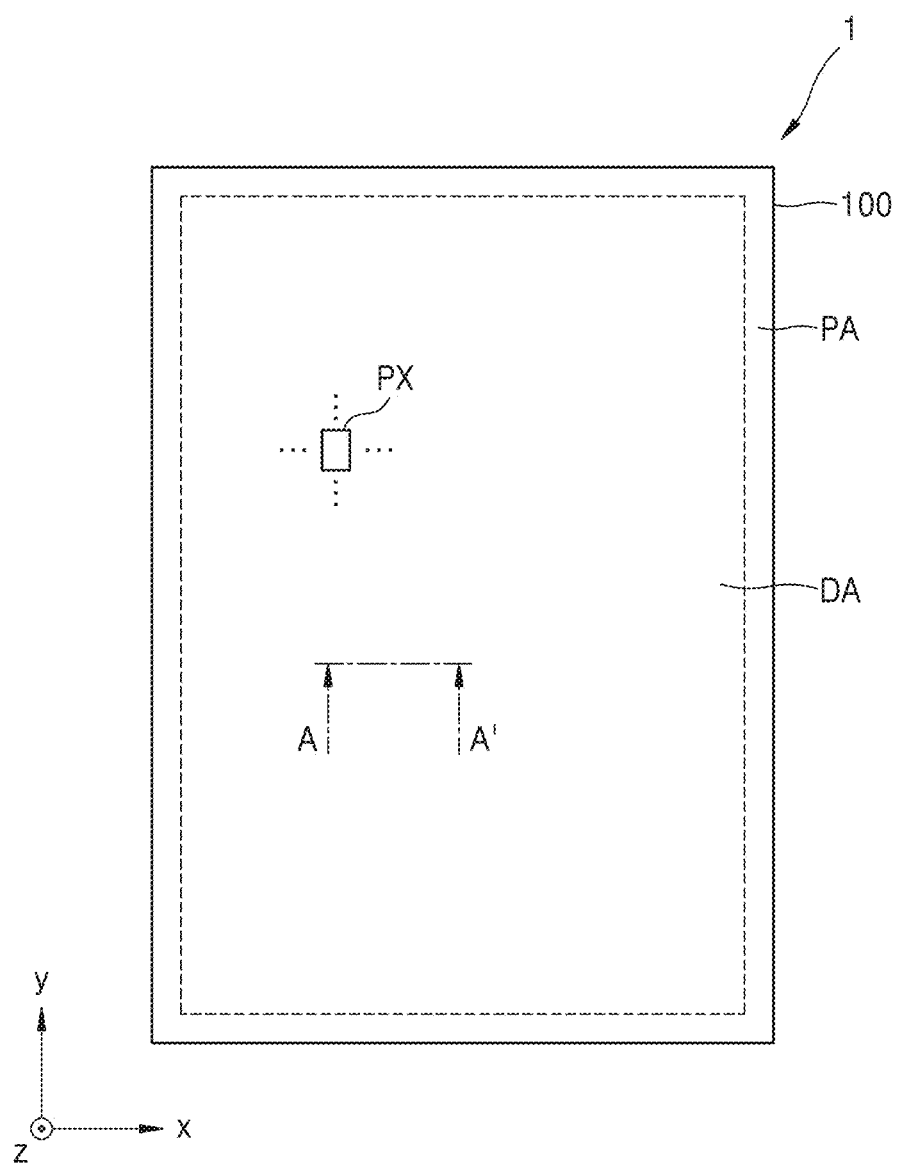
FIG. 1 is a schematic plan view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. Characteristics and features of the disclosure, and implementation methods thereof will be clarified through following embodiments described with reference to the accompanying drawings. The disclosure may, however, be embodied in many different forms and should not be construed as limited to the embodiments set forth herein.

Hereinafter, embodiments will be described in detail by referring to the accompanying drawings. In descriptions with reference to the drawings, the same reference numerals are given to elements that are the same or substantially the same and descriptions will not be repeated.

It will be understood that although the terms "first", "second", etc. may be used herein to describe various elements, these elements should not be limited by these terms. These elements are only used to distinguish one element from another.

The singular forms "a," "an," and "the" as used herein are intended to include the plural forms as well unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be understood that when a layer, a region, or an element is referred to as being "on," another layer, region, or element, it may be directly on the other layer, region, or element, or intervening layers, regions, or elements may be present therebetween.

Sizes of elements in the drawings may be exaggerated or reduced for convenience of explanation. In other words, because sizes and thicknesses of elements in the drawings are arbitrarily illustrated for convenience of description, the following embodiments are not limited thereto.

In the case where a certain embodiment may be implemented differently, a specific process order may be performed in the order different from the described order. As an example, two processes that are successively described may be performed substantially simultaneously or performed in the order opposite to the order described.

In the specification, the expression such as "A and/or B" may include A, B, or A and B. In addition, the expression such as "at least one of A and B" may include A, B, or A and B.

It will be understood that when a layer, region, or element is referred to as being "connected to" another layer, region, or element, it may be "directly connected to" the other layer, region, or element or may be "indirectly connected to" the other layer, region, or element with one or more intervening layers, regions, or elements therebetween. For example, it will be understood that when a layer, region, or element is referred to as being "electrically connected to" another layer, region, or element, it may be "directly electrically connected to" the other layer, region, or element and/or may be "indirectly electrically connected to" the other layer, region, or element with one or more intervening layers, regions, or elements therebetween.

The x axis, the y axis, and the z axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a plan view of a display apparatus 1 according to some embodiments.

Referring to FIG. 1, the display apparatus 1 includes a display area DA where an image is displayed, and a peripheral area PA surrounding at least a portion of the display area DA. The display apparatus 1 may display images to the outside by using light emitted from the display area DA. Because the display apparatus 1 includes a substrate 100, the substrate 100 may include such the display area DA and peripheral area PA. In other words, such the display area DA and peripheral area PA may also be defined in the substrate 100.

The substrate 100 may include various materials, such as glass, metal, or plastic. According to some embodiments, the substrate 100 may include a flexible material. In this regard, the flexible material refers to a material that is relatively easily bent and curved and is foldable or rollable. The substrate 100 including a flexible material may include ultra-thin glass, metal, or plastic.

The display area DA may have a rectangular shape as shown in FIG. 1. According to some embodiments, the display area DA may have a polygonal shape, such as a triangular shape, a pentagonal shape, or a hexagonal shape, a circular shape, an elliptical shape, an irregular shape, or the like.

Pixels PX including various display elements, such as an organic light-emitting diode (OLED), may be arranged in the display area DA of the substrate 100. The pixels PX are provided in a plural number, and the plurality of pixels PX may be arranged in various forms, such as a stripe arrangement, a Pentile arrangement, or a mosaic arrangement to realize an image. Hereinafter, as used herein, the pixels PX refer to sub-pixels that emit light of different colors, and each pixel PX may be one of, e.g., a red sub-pixel, a green sub-pixel, and a blue sub-pixel.

As the display apparatus according to some embodiments, an organic light-emitting display is described as an example, but the display apparatus according to one or more embodiments is not limited thereto. According to some embodiments, the display apparatus may include an inorganic light-emitting display, an inorganic electroluminescence (EL) display apparatus, or a quantum dot light-emitting display apparatus. For example, an emission layer of a display element provided in the display apparatus may include an organic material, an inorganic material, quantum dots, an organic material and quantum dots, an inorganic material and quantum dots, or an organic material, an inorganic material, and quantum dots.

The peripheral area PA of the substrate 100 is arranged around the display area DA, and may be an area where an image is not displayed. In the peripheral area PA, various wires configured to transmit an electrical signal to be applied to the display area DA, and pads to which a printed circuit board or a driver integrated circuit (IC) chip is attached may be located.

Figure 2:
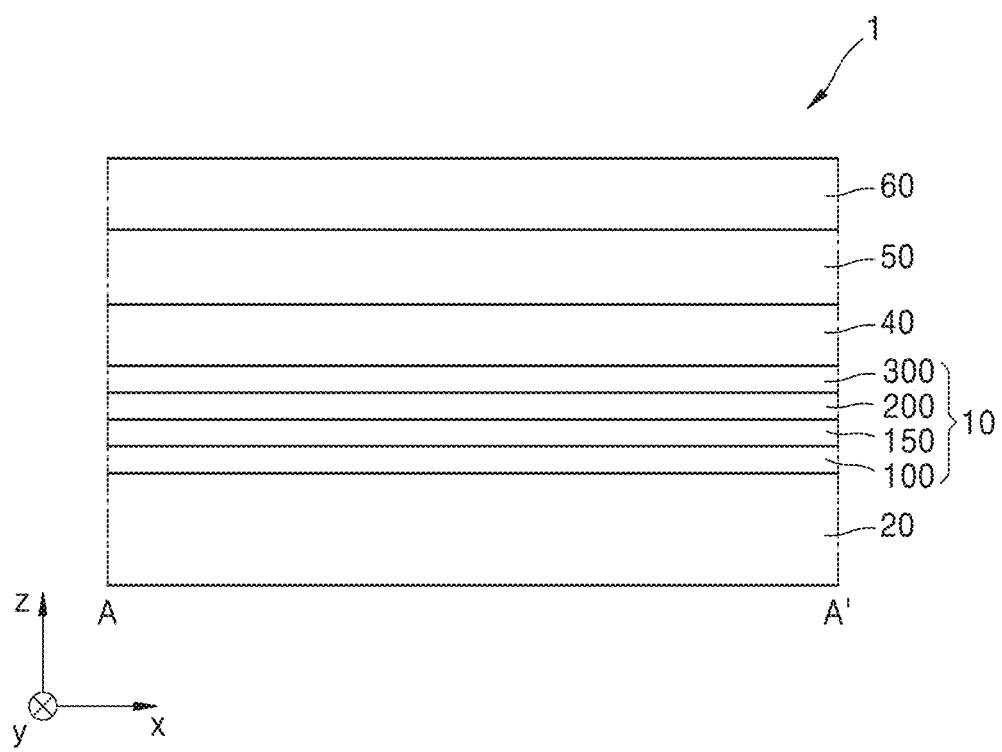
FIG. 2 is a cross-sectional view of a region of the display apparatus of FIG. 1, taken along a line A-A' according to some embodiments.

FIG. 2 is a cross-sectional view of a region of the display apparatus 1 of FIG. 1, taken along a line A-A'.

Referring to FIG. 2, the display apparatus 1 may include a display panel 10, a lower protective film 20, a touch sensing layer 40, an optical functional layer 50, and a cover window 60.

The display panel 10 may include the substrate 100, a circuit layer 150 located on the substrate 100, a display layer 200 located on the circuit layer 150, and an encapsulation layer 300 located on the display layer 200.

The substrate 100 may include glass or a polymer resin. For example, the polymer resin may include polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the aforementioned polymer resin and an inorganic layer.

The circuit layer 150 may include at least one transistor (e.g., a thin-film transistor), at least one capacitor, and an insulating layer. The display layer 200 may include an OLED, which is a display element. The at least one transistor and the display element may constitute a pixel and may be electrically connected to each other.

The encapsulation layer 300 may cover the display layer 200. According to some embodiments, the encapsulation layer 300 may include at least one inorganic encapsulation layer and/or at least one organic encapsulation layer. The at least one inorganic encapsulation layer may include one or more inorganic insulating materials, such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$), and may be formed by chemical vapor deposition (CVD) or the like. The $ZnO_x$ may be ZnO and/or $ZnO_2$. The organic encapsulation layer may include a polymer-based material. The polymer-based material may include a silicon-based resin, an acrylic resin, an epoxy-based resin, polyimide, and polyethylene.

Although FIG. 2 illustrates that the display layer 200 is covered with the encapsulation layer 300, according to some embodiments, the display layer 200 may be encapsulated with an encapsulation substrate.

The lower protective film 20 may be arranged under the display panel 10 (e.g., in a −z direction). The lower protective film 20 may be attached to the bottom surface of the substrate 100. An adhesive layer may be between the lower protective film 20 and the substrate 100. Alternatively, the lower protective film 20 may be directly formed on the bottom surface of the substrate 100, and in this case, the adhesive layer may not be between the lower protective film 20 and the substrate 100.

The lower protective film 20 may support and protect the substrate 100. The lower protective film 20 may include polyethylene terephthalate (PET) or polyimide (PI).

The touch sensing layer 40 may be formed on the encapsulation layer 300. Alternatively, the touch sensing layer 40 may be separately formed and then may be coupled to the encapsulation layer 300 through an adhesive layer, such as an optically clear adhesive (OCA). According to some embodiments, the touch sensing layer 40 may be directly formed on the encapsulation layer 300 as shown in FIG. 2, and in this case, the adhesive layer may not be between the touch sensing layer 40 and the encapsulation layer 300.

The touch sensing layer 40 may obtain coordinate information according to an external input, e.g., a touch event. The touch sensing layer 40 may include a sensing electrode, and signal lines connected to the sensing electrode. The touch sensing layer 40 may sense an external input in a mutual capacitance method or a self-capacitance method.

The optical functional layer 50 may be formed on the touch sensing layer 40. The optical functional layer 50 may include an anti-reflective layer. The anti-reflective layer may reduce reflectance of light (external light) incident from the outside toward the display panel 10.

According to some embodiments, the optical functional layer 50 may include a polarization film.

According to some embodiments, the optical functional layer 50 may include a filter plate including a black matrix and color filters.

The cover window 60 may be located on the optical functional layer 50. The cover window 60 may protect the display panel 10.

The cover window 60 may include a flexible window. The cover window 60 may protect the display panel 10 by easily bending according to external force without cracking. The cover window 60 may include glass, sapphire, or plastic. As an example, the cover window 60 may include ultras thin glass (UTG®) or colorless polyimide (CPI). According to some embodiments, the cover window 60 may have a structure in which a flexible polymer layer is located on one surface of a glass substrate, or may include a polymer layer only.

Figure 3:
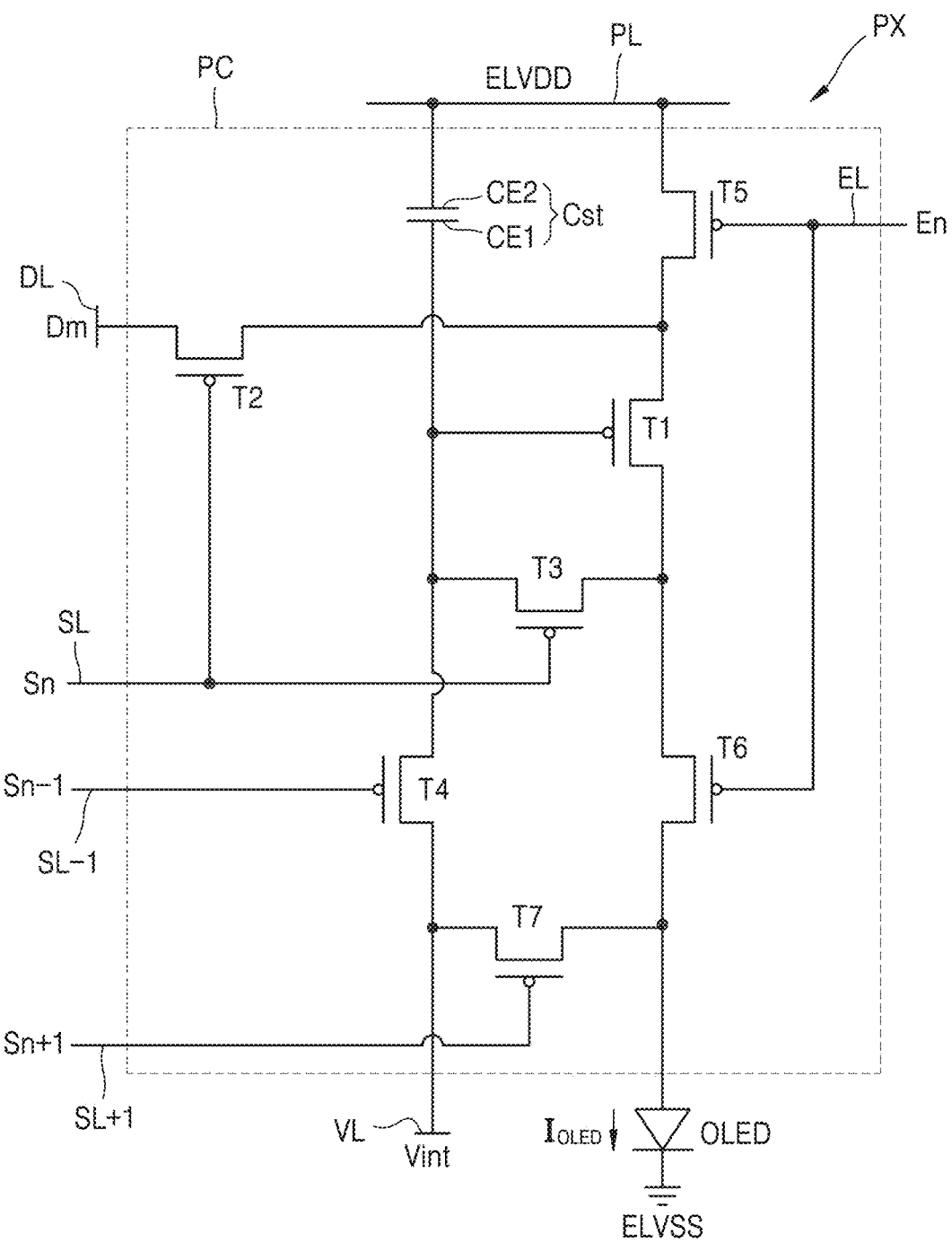
FIG. 3 is an equivalent circuit diagram of a pixel included in the display apparatus of FIG. 1 according to some embodiments.

FIG. 3 is an equivalent circuit diagram of a pixel included in the display apparatus 1 of FIG. 1.

Referring to FIG. 3, one pixel PX may include a pixel circuit PC and an organic light-emitting diode OLED electrically connected to the pixel circuit PC.

For example, as shown in FIG. 3, the pixel circuit PC includes first to seventh transistors T1, T2, T3, T4, T5, T6, and T7 and a storage capacitor Cst. The first to seventh transistors T1 to T7 and the storage capacitor Cst are connected to first to third scan lines SL, SL−1, and SL+1 for respectively transmitting first to third scan signals Sn, Sn−1, and Sn+1, a data line DL for transmitting a data voltage Dm, an emission control line EL for transmitting an emission control signal En, a driving voltage line PL for transmitting a first driving voltage ELVDD, an initialization voltage line VL for transmitting an initialization voltage Vint, and a common electrode to which a second driving voltage ELVSS is applied.

The first transistor T1 is a driving transistor in which a magnitude of a drain current is determined according to a gate-source voltage, and the second to seventh transistors T2 to T7 may be switching transistors that are turned on/off according to the gate-source voltage, substantially, a gate voltage. The first to seventh transistors T1 to T7 may include thin-film transistors.

The first transistor T1 may be referred to as a driving transistor, the second transistor T2 may be referred to as a scan transistor, the third transistor T3 may be referred to as a compensation transistor, the fourth transistor T4 may be referred to as a gate initialization transistor, the fifth transistor T5 may be referred to as a first emission control transistor, the sixth transistor T6 may be referred to as a second emission control transistor, and the seventh transistor T7 may be referred to as an anode initialization transistor.

The storage capacitor Cst is connected between the driving voltage line PL and a gate of the driving transistor T1. The storage capacitor Cst may have an upper electrode CE2 connected to the driving voltage line PL, and a lower electrode CE1 connected to the gate of the driving transistor T1.

The driving transistor T1 may be configured to control a magnitude of a driving current $I_{OLED}$ flowing from the driving voltage line PL to the organic light-emitting diode OLED according to the gate-source voltage. The driving transistor T1 may have the gate connected to the lower electrode CE1 of the storage capacitor Cst, a source connected to the driving voltage line PL through the first emission control transistor T5, and a drain connected to the organic light-emitting diode OLED through the second emission control transistor T6.

The driving transistor T1 may be configured to output the driving current $I_{OLED}$ to the organic light-emitting diode OLED according to the gate-source voltage. The magnitude of the driving current $I_{OLED}$ is determined based on a difference between a threshold voltage and the gate-source voltage of the driving transistor T1. The organic light-emitting diode OLED may be configured to receive the driving current $I_{OLED}$ from the driving transistor T1, and emit light with a brightness according to the magnitude of the driving current $I_{OLED}$.

The scan transistor T2 is configured to transmit the data voltage Dm to the source of the driving transistor T1 in response to the first scan signal Sn. The scan transistor T2 may have a gate connected to the first scan line SL, a source connected to the data line DL, and a drain connected to the source of the driving transistor T1.

The compensation transistor T3 is connected in series between the drain and the gate of the driving transistor T1, and connects the drain and the gate of the driving transistor T1 to each other in response to the first scan signal Sn. The compensation transistor T3 may have a gate connected to the first scan line SL, a source connected to the drain of the driving transistor T1, and a drain connected to the gate of the driving transistor T1. Although FIG. 3 illustrates that the compensation transistor T3 is provided as one transistor, according to some embodiments, the compensation transistor T3 may include two transistors connected in series with each other.

The gate initialization transistor T4 is configured to apply the initialization voltage Vint to the gate of the driving transistor T1 in response to the second scan signal Sn−1. The gate initialization transistor T4 may have a gate connected to the second scan line SL−1, a source connected to the gate of the driving transistor T1, and a drain connected to the initialization voltage line VL. Although FIG. 3 illustrates that the gate initialization transistor T4 is provided as one transistor, according to some embodiments, the gate initialization transistor T4 may include two transistors connected in series with each other.

The anode initialization transistor T7 is configured to apply the initialization voltage Vint to an anode of the organic light-emitting diode OLED in response to the third scan signal Sn+1. The anode initialization transistor T7 may have a gate connected to the third scan line SL+1, a source connected to the anode of the organic light-emitting diode OLED, and a drain connected to the initialization voltage line VL.

The first emission control transistor T5 may connect the driving voltage line PL and the source of the driving transistor T1 to each other in response to the emission control signal En. The first emission control transistor T5 may have a gate connected to the emission control line EL, a source connected to the driving voltage line PL, and a drain connected to the source of the driving transistor T1.

The second emission control transistor T6 may connect the drain of the driving transistor T1 and the anode of the organic light-emitting diode OLED to each other in response to the emission control signal En. The second emission control transistor T6 may have a gate connected to the emission control line EL, a source connected to the drain of the driving transistor T1, and a drain connected to the anode of the organic light-emitting diode OLED.

The second scan signal Sn−1 may be substantially synchronized with a first scan signal Sn in a previous row. The third scan signal Sn+1 may be substantially synchronized with the first scan signal Sn. According to another example, the third scan signal Sn+1 may be substantially synchronized with a first scan signal Sn in a next row.

According to some embodiments, the first to seventh transistors T1 to T7 may include semiconductor layers including silicon. For example, the first to seventh transistors T1 to T7 may include semiconductor layers including low temperature polysilicon (LTPS). A polysilicon material has a high electron mobility (100 $cm^2/Vs$ or greater), and thus has low energy consumption power and high reliability.

According to another example, the semiconductor layers of the first to seventh transistors T1 to T7 may include oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, each of the semiconductor layers of the first to seventh transistors T1 to T7 may be an InSnZnO (ITZO) semiconductor layer, an InGaZnO (IGZO) semiconductor layer, or the like.

As another example, some of the semiconductor layers of the first to seventh transistors T1 to T7 may include LTPS, and others thereof may include an oxide semiconductor (e.g., IGZO).

Hereinafter, a detailed operation process of a pixel PX of the display apparatus according to some embodiments is described in more detail. As shown in FIG. 3, the first to seventh transistors T1 to T7 are assumed to be p-type metal-oxide-semiconductor field-effect transistors (MOSFETs).

First, in response to receipt of an emission control signal En of a high level, the first emission control transistor T5 and the second emission control transistor T6 are turned off, the driving transistor T1 stops outputting the driving current $I_{OLED}$, and the organic light-emitting diode OLED stops emitting light.

Thereafter, during a gate initialization period in which a second scan signal Sn−1 of a low level is received, the gate initialization transistor T4 is turned on, and the initialization voltage Vint is applied to the gate of the driving transistor T1, i.e., to the lower electrode CE1 of the storage capacitor Cst. A difference (ELVDD-Vint) between the first driving voltage ELVDD and the initialization voltage Vint is stored in the storage capacitor Cst.

Then, during a data writing period in which a first scan signal Sn of a low level is received, the scan transistor T2 and the compensation transistor T3 are turned on, and the data voltage Dm is received by the source of the driving transistor T1. The driving transistor T1 is diode-connected by the compensation transistor T3 and is biased in a forward direction. A gate voltage of the driving transistor T1 increases from the initialization voltage Vint. When the gate voltage of the driving transistor T1 becomes equal to a data compensation voltage (Dm−|Vth|) obtained by reducing a threshold voltage Vth of the driving transistor T1 from the data voltage Dm, the driving transistor T1 is turned off, and the gate voltage of the driving transistor T1 stops increasing. Accordingly, the storage capacitor Cst stores a difference (ELVDD−Dm+|Vth|) between the first driving voltage ELVDD and the data compensation voltage (Dm−|Vth|).

During an anode initialization period in which a third scan signal Sn+1 of a low level is received, the anode initialization transistor T7 is turned on, and the initialization voltage Vint is applied to the anode of the organic light-emitting diode OLED. By allowing the organic light-emitting diode OLED to completely emit no light by applying the initialization voltage Vint to the anode of the organic light-emitting diode OLED, a pixel PX receives a data voltage Dm corresponding to a black grayscale in a next frame, but minute light emission of the organic light-emitting diode OLED may be prevented or reduced.

The first scan signal Sn and the third scan signal Sn+1 may be substantially synchronized with each other. In this case, the data writing period and the anode initialization period may be the same periods.

Thereafter, in response to receipt of an emission control signal En of a low level, the first emission control transistor T5 and the second emission control transistor T6 may be turned on, the driving transistor T1 may be configured to output a driving current $I_{OLED}$ corresponding to a voltage (ELVDD−Dm) obtained by subtracting the threshold voltage |Vth| of the driving transistor T1 from a voltage stored in the storage capacitor Cst, i.e., the source-gate voltage (ELVDD−Dm+|Vth|) of the driving transistor T1, and the organic light-emitting diode OLED may emit light with a brightness corresponding to the magnitude of the driving current $I_{OLED}$.

In addition, in FIG. 3, an example in which the pixel circuit PC includes seven transistors and one storage capacitor has been described, but one or more embodiments are not limited thereto. As an example, the pixel circuit PC may include two or more transistors and/or two or more storage capacitors. According to some embodiments, the pixel circuit PC may include two transistors and one storage capacitor.

Figure 4:
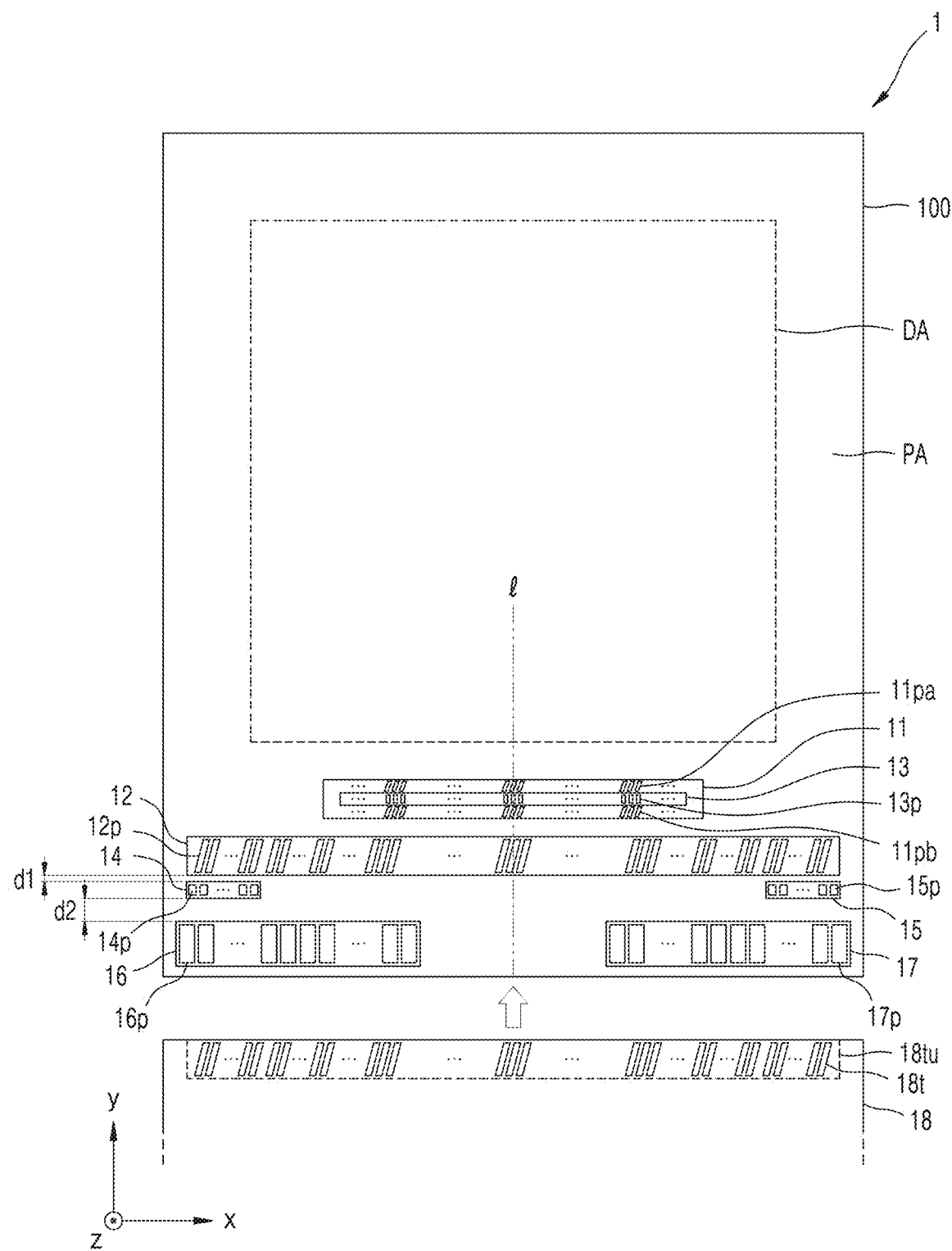
FIG. 4 is a schematic plan view of a display apparatus according to some embodiments.

FIG. 4 is a schematic plan view of the display apparatus 1 according to some embodiments.

Referring to FIG. 4, the display apparatus 1 includes the display area DA where an image is displayed, and the peripheral area PA surrounding at least a portion of the display area DA. The display apparatus 1 may provide an image to the outside by using light emitted from the display area DA. Because the display apparatus 1 includes a substrate 100, the substrate 100 may include such the display area DA and peripheral area PA. In other words, such the display area DA and peripheral area PA may also be defined in the substrate 100.

As described with reference to FIG. 1, the pixels PX including various display elements, such as an OLED, may be arranged in the display area DA.

In the peripheral area PA, a driving chip 11, output pads 11*pa*, input pads 11*pb*, a pad portion 12, a data test pad portion 13, a first test pad portion 14, a second test pad portion 16, a third test pad portion 15, and a fourth test pad portion 17. For example, the driving chip 11, the output pads 11*pa*, the input pads 11*pb*, the pad portion 12, the data test pad portion 13, the first test pad portion 14, the second test pad portion 16, the third test pad portion 15, and the fourth test pad portion 17 may be located on one side of the peripheral area PA.

The driving chip 11 may include output terminals and input terminals. Information about an image to be realized in the display area DA may be input to the driving chip 11 through the input terminals of the driving chip 11. For example, the driving chip 11 may be an IC chip or the like.

In addition, although FIG. 4 illustrates that the driving chip 11 is located (or mounted) on the peripheral area PA of the substrate 100, according to some embodiments, the driving chip 11 may also be located (or mounted) on a printed circuit board 18 to be described below.

The output pads 11*pa* may be connected to the output terminals of the driving chip 11, and the input pads 11*pb* may be connected to the input terminals of the driving chip 11. The output pads 11*pa* and the input pads 11*pb* may be arranged in a second direction (e.g., a ±x direction). According to some embodiments, as shown in FIG. 4, each of the output pads 11*pa* and the input pads 11*pb* may have a parallelogrammic planar shape.

Figure 5:
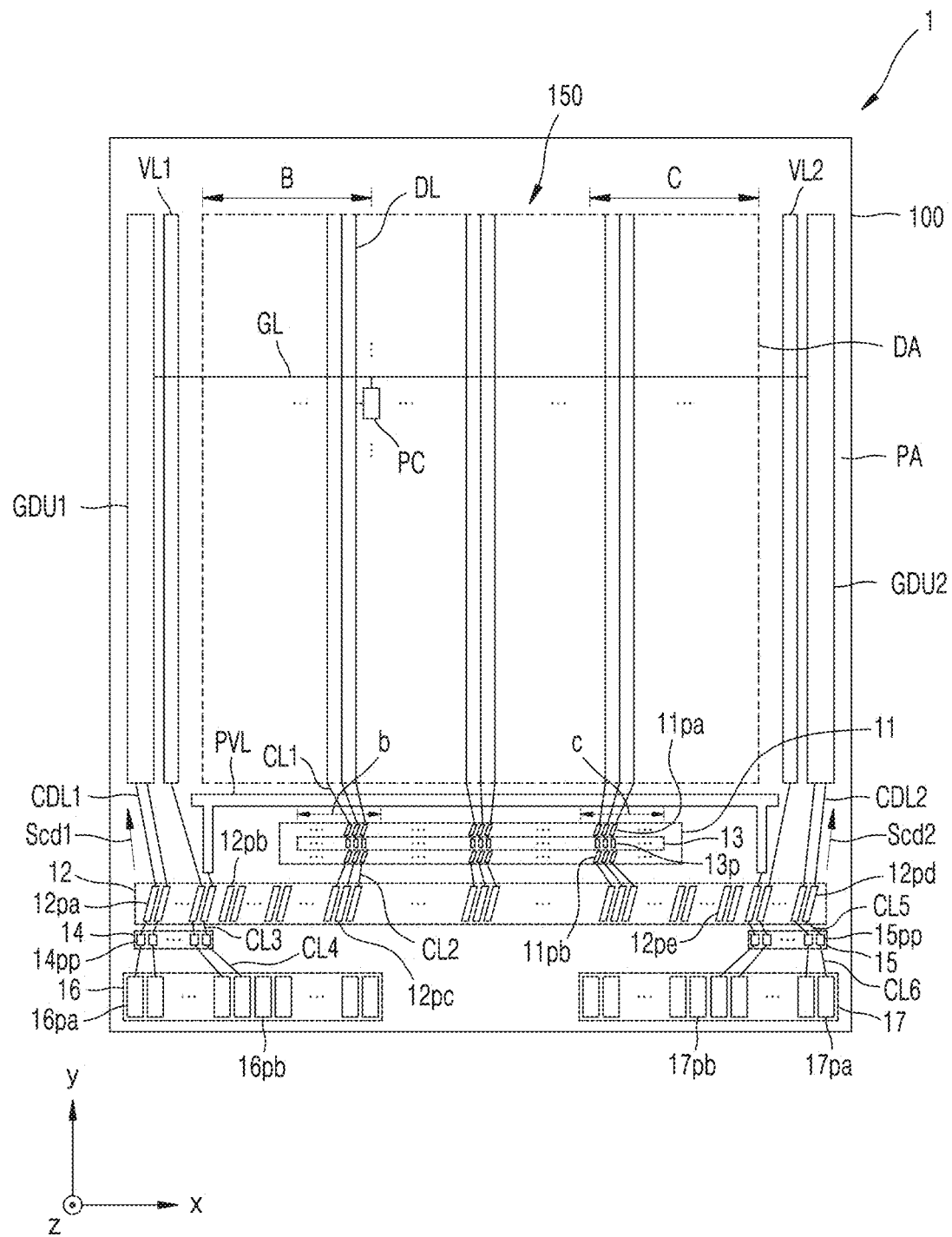
FIG. 5 is a schematic plan view of a display apparatus according to some embodiments.

Moreover, as shown in FIG. 5 to be described below, the output pads 11*pa* may be connected to data lines DL of the display area DA through first connection lines CL1, respectively. When the display apparatus 1 is being driven, an electrical signal from the driving chip 11 may be transmitted from the output terminals of the driving chip 11 to the data lines DL via the output pads 11*pa* and the first connection lines CL1, and as a result, may be transmitted to the pixels PX in the display area DA.

The pad portion 12 may include pads 12*p*. The pad portion 12 may be electrically connected to the printed circuit board 18. That is, the pad portion 12 may be electrically connected to a terminal portion 18*tu* of the printed circuit board 18. The pads 12*p* of the pad portion 12 may be electrically connected to terminals 18*t* of the terminal portion 18*tu*. The pads 12*p* of the pad portion 12 may be arranged in the second direction (e.g., the ±x direction). According to some embodiments, as shown in FIG. 4, each of the pads 12*p* of the pad portion 12 may have a parallelogrammic planar shape.

The data test pad portion 13 may include data test pads 13*p*. The data test pads 13*p* may be arranged in the second direction (e.g., the ±x direction). According to some embodiments, as shown in FIG. 4, each of the data test pads 13*p* may have a rectangular planar shape. According to some embodiments, as shown in FIG. 4, the data test pad portion 13 may overlap the driving chip 11 in a plan view.

In addition, as shown in FIG. 5 to be described below, the data test pads 13*p* may be electrically connected to the data lines DL of the display area DA, respectively. For example, the data test pads 13*p* may be connected to the output pads 11*pa*, respectively. Because the output pads 11*pa* are connected to the data lines DL through the first connection lines CL1, the data test pads 13*p* may be connected to the data lines DL through the output pads 11*pa* and the first connection lines CL1. The data test pad portion 13 may be used to test the display apparatus 1. When testing the display apparatus 1, a test data signal may be applied to the data test pads 13*p* through probes (or probe pins). The test data signal may be transmitted from the data test pad portion 13 to the data lines DL via the output pads 11*pa* and the first connection lines CL1.

The first test pad portion 14 may include first test pads 14*p*. The first test pads 14*p* may be arranged in the second direction (e.g., the ±x direction). According to some embodiments, as shown in FIG. 4, each of the first test pads 14p may have a rectangular planar shape. According to some embodiments, a size of each of the first test pads 14p may be greater than a size of each of the data test pads 13p. For example, the size of each of the first test pads 14p may be about 3 times to about 7 times the size of each of the data test pads 13p.

The first test pad portion 14 may be used to test pixel circuits PC (see FIG. 3) arranged in the display area DA. When testing the pixel circuits PC, a test circuit driving signal may be applied to the first test pads 14p through the probes. The test circuit driving signal may be transmitted from the first test pad portion 14, via the pad portion 12, to a first gate driver GDU1, a first voltage supply line VL1, and a driving voltage supply line PVL of FIG. 5 to be described below.

The second test pad portion 16 may include second test pads 16p. The second test pads 16p may be arranged in the second direction (e.g., the ±x direction). According to some embodiments, as shown in FIG. 4, each of the second test pads 16p may have a rectangular planar shape. According to some embodiments, the size of each of the first test pads 14p may be less than a size of each of the second test pads 16p. For example, the size of each of the second test pads 16p may be about 10 times to about 15 times the size of each of the first test pads 14p. According to some embodiments, the number of first test pads 14p of the first test pad portion 14 may be less than the number of second test pads 16p of the second test pad portion 16.

The second test pad portion 16 may be used to test the touch sensing layer 40 (see FIG. 2) and the pixels PX arranged in the display area DA. When testing the pixels PX and the touch sensing layer 40, a test circuit driving signal may be applied to some of the second test pads 16p, and a test touch driving signal may be applied to others of the second test pads 16p, through the probes. The test circuit driving signal may be transmitted from the second test pad portion 16, via the first test pad portion 14 and the pad portion 12, to the first gate driver GDU1, the first voltage supply line VL1, and the driving voltage supply line PVL of FIG. 5 to be described below. The test touch driving signal may be transmitted from the second test pad portion 16, via the pad portion 12, to sensing electrode lines 400 of FIG. 6 to be described below.

The third test pad portion 15 may include third test pads 15p. The third test pads 15p may be arranged in the second direction (e.g., the ±x direction). According to some embodiments, as shown in FIG. 4, each of the third test pads 15p may have a rectangular planar shape. According to some embodiments, a size of each of the third test pads 15p may be greater than the size of each of the data test pads 13p. For example, the size of each of the third test pads 15p may be about 3 times to about 7 times the size of each of the data test pads 13p.

The third test pad portion 15 may be used to test the pixel circuits PC arranged in the display area DA in the same manner as the first test pad portion 14. When testing the pixel circuits PC, a test circuit driving signal may be applied to the third test pads 15p through the probes. The test circuit driving signal may be transmitted from the third test pad portion 15, via the pad portion 12, to a second gate driver GDU2, a second voltage supply line VL2, and the driving voltage supply line PVL of FIG. 5 to be described below.

According to some embodiments, the first test pad portion 14 and the third test pad portion 15 may be symmetrical to each other with respect to the data test pad portion 13. For example, as shown in FIG. 4, the first test pad portion 14 and the third test pad portion 15 may be symmetrical to each other with respect to a virtual line l passing through the center of the data test pad portion 13.

The fourth test pad portion 17 may include fourth test pads 17p. The fourth test pads 17p may be arranged in the second direction (e.g., the ±x direction). According to some embodiments, as shown in FIG. 4, each of the fourth test pads 17p may have a rectangular planar shape. According to some embodiments, the size of each of the third test pads 15p may be less than a size of each of the fourth test pads 17p. For example, the size of each of the fourth test pads 17p may be about 10 times to about 15 times the size of each of the third test pads 15p. According to some embodiments, the number of third test pads 15p of the third test pad portion 15 may be less than the number of fourth test pads 17p of the fourth test pad portion 17.

The fourth test pad portion 17 may be used to test the touch sensing layer 40 and the pixels PX arranged in the display area DA in the same manner as the second test pad portion 16. When testing the pixels PX and the touch sensing layer 40, a test circuit driving signal may be applied to some of the fourth test pads 17p, and a test touch driving signal may be applied to others of the fourth test pads 17p, through the probes. The test circuit driving signal may be transmitted from the fourth test pad portion 17, via the third test pad portion 15 and the pad portion 12, to the second gate driver GDU2, the second voltage supply line VL2, and the driving voltage supply line PVL of FIG. 5 to be described below. The test touch driving signal may be transmitted from the fourth test pad portion 17, via the pad portion 12, to sensing electrode lines 400 of FIG. 6 to be described below.

According to some embodiments, the second test pad portion 16 and the fourth test pad portion 17 may be symmetrical to each other with respect to the data test pad portion 13. For example, as shown in FIG. 4, the second test pad portion 16 and the fourth test pad portion 17 may be symmetrical to each other with respect to the virtual line l passing through the center of the data test pad portion 13.

According to some embodiments, the data test pad portion 13, the pad portion 12, the first test pad portion 14, and the second test pad portion 16 may be sequentially arranged in a first direction (e.g., a ±y direction). The pad portion 12 may at least partially overlap the data test pad portion 13 in the first direction (e.g., the ±y direction). The first test pad portion 14 may not overlap the data test pad portion 13 in the first direction (e.g., the ±y direction). The second test pad portion 16 may at least partially overlap the data test pad portion 13 in the first direction (e.g., the ±y direction).

As a comparative example, the first test pad portion 14 located on one side of the peripheral area PA may be omitted. When the first test pad portion 14 is omitted, the data test pad portion 13 and the second test pad portion 16 may be used when testing the pixel circuit PC. A test apparatus for testing the pixel circuit PC may include probes that apply a test signal to the data test pad portion 13 and the second test pad portion 16. The probes of the test apparatus are unable to be physically arranged in parallel (or in two rows) in the first direction (e.g., the ±y direction) due to spatial restrictions, such as an arrangement structure of wires connected to the probes. Accordingly, some of the data test pads of the data test pad portion 13 overlapping the second test pad portion 16 in the first direction (e.g., the ±y direction) are not in contact with the probes of the test apparatus. Because the test signal is not applied to some of the data test pads that are not in contact with the probes of the test apparatus, the pixel circuits PC connected to the data lines DL electrically connected to some of the data test pads are unable to be tested. For example, the pixel circuits PC arranged at a left edge of the display area DA shown in FIG. 4 are unable to be tested. The left edge of the display area DA becomes an untestable region.

However, according to some embodiments, when the first test pad portion 14 not overlapping the data test pad portion 13 in the first direction (e.g., the ±y direction) is arranged, all of the data test pads 13p of the data test pad portion 13 are able to be in contact with the probes of the test apparatus. Accordingly, all of the pixel circuits PC are able to be tested. The left edge of the display area DA becomes a testable region.

According to some embodiments, a first distance d1 between the pad portion 12 and the first test pad portion 14 in the first direction (e.g., the ±y direction) may be less than a second distance d2 between the first test pad portion 14 and the second test pad portion 16 in the first direction (e.g., the ±y direction).

Although the above description has been provided based on the first test pad portion 14 and the second test pad portion 16, the same description may be applied to the third test pad portion 15 and the fourth test pad portion 17.

The display apparatus 1 may include the printed circuit board 18. The printed circuit board 18 may be attached to one side of the peripheral area PA. The printed circuit board 18 may be mounted on the pad portion 12, and the terminal portion 18tu of the printed circuit board 18 may be electrically connected to the pad portion 12. The terminal portion 18tu of the printed circuit board 18 may include terminals 18t corresponding to the pads 12p of the pad portion 12, respectively. The printed circuit board 18 may be configured to transmit a signal or power of a controller to the pad portion 12.

FIG. 5 is a schematic plan view of the display apparatus 1 according to some embodiments. For example, FIG. 5 is a schematic plan view of the display apparatus 1 based on the circuit layer 150 of FIG. 2 described above. In FIG. 5, the same elements as those in FIG. 4 are denoted by the same reference numerals, and thus, a repeated description thereof will be omitted.

Referring to FIG. 5, the display apparatus 1 may include the display area DA and the peripheral area PA, and may include the pixel circuits PC arranged in the display area DA.

Each pixel circuit PC may be electrically connected to drivers and voltage supply lines arranged in the peripheral area PA. In the peripheral area PA, the first gate driver GDU1, the second gate driver GDU2, the first voltage supply line VL1, the second voltage supply line VL2, the driving voltage supply line PVL, the output pads 11pa, the input pads 11pb, the pad portion 12, the data test pad portion 13, the first test pad portion 14, the second test pad portion 16, the third test pad portion 15, and the fourth test pad portion 17 may be arranged.

The first gate driver GDU1 may transmit a gate signal to each pixel circuit PC through a gate line GL. The gate line GL may extend in the second direction (e.g., the ±x direction) and be connected to pixel circuits PC positioned in the same row among the plurality of pixel circuits PC. The gate line GL may include the first to third scan lines SL, SL−1, and SL+1 (see FIG. 3) and the emission control line EL (see FIG. 3). The gate signal may include the first to third scan signals Sn, Sn−1, and Sn+1 (see FIG. 3) and the emission control signal Sn (see FIG. 3) of FIG. 3 described above. The first gate driver GDU1 may be arranged in a portion of the peripheral area PA corresponding to the left side of the substrate 100.

The second gate driver GDU2 may transmit a gate signal to each pixel circuit PC through the gate line GL. The second gate driver GDU2 may be arranged in parallel with the first gate driver GDU1 with the display area DA therebetween. For example, as shown in FIG. 5, the second gate driver GDU2 may be arranged in a portion of the peripheral area PA corresponding to the right side of the substrate 100.

Although FIG. 5 illustrates that the first gate driver GDU1 and the second gate driver GDU2 are respectively located on the left and right sides of the peripheral area PA, according to some embodiments, one of the first gate driver GDU1 and the second gate driver GDU2 may be omitted.

The first voltage supply line VL1 may be configured to transmit a voltage to each pixel circuit PC. For example, the first voltage supply line VL1 may be configured to transmit the initialization voltage Vint (see FIG. 3) to each pixel circuit PC through the initialization voltage line VL (see FIG. 3). The first voltage supply line VL1 may be between the first gate driver GDU1 and the display area DA.

The second voltage supply line VL2 may be configured to transmit a voltage to each pixel circuit PC. For example, the second voltage supply line VL2 may be configured to transmit the initialization voltage Vint to each pixel circuit PC through the initialization voltage line VL. The second voltage supply line VL2 may be between the second gate driver GDU2 and the display area DA.

Although FIG. 5 illustrates that the first voltage supply line VL1 and the second voltage supply line VL2 are spaced apart from each other, according to some embodiments, the first voltage supply line VL1 and the second voltage supply line VL2 may be connected to each other. For example, the first voltage supply line VL1 and the second voltage supply line VL2 may be connected to each other and partially surround the display area DA in a loop shape with one side open.

The driving voltage supply line PVL may be located on one side of the peripheral area PA. The driving voltage supply line PVL may substantially extend in the second direction (e.g., the ±x direction). The driving voltage supply line PVL may be configured to transmit a voltage to each pixel circuit PC. For example, the driving voltage supply line PVL may be configured to transmit the first driving voltage ELVDD (see FIG. 3) to each pixel circuit PC through the driving voltage line PL (see FIG. 3).

The output pads 11pa and the input pads 11pb may be located on one side of the peripheral area PA (e.g., in a portion of the peripheral area PA corresponding to the lower end of the substrate 100). As another example, the output pads 11pa and the input pads 11pb may also be arranged in the printed circuit board 18 of FIG. 4 described above. The output pads 11pa may be connected to the data lines DL through the first connection lines CL1, respectively. Each of the output pads 11pa may be configured to transmit a data voltage to each pixel circuit PC through the data line DL. The data line DL may extend in the first direction (e.g., the ±y direction) and be connected to pixel circuits PC positioned in the same row among the plurality of pixel circuits PC.

Although FIG. 5 illustrates that the output pads 11pa are connected to the data lines DL in a one-to-one manner, according to some embodiments, the output pads 11pa and the data lines DL may not correspond to each other in a one-to-one manner. For example, some of the data lines DL may be connected to the same output pad 11*pa* among the output pads 11*pa* through a multiplexer.

The pad portion 12 may be located on one side of the peripheral area PA (e.g., in a portion of the peripheral area PA corresponding to the lower end of the substrate 100). The pad portion 12 may include first circuit pads 12*pa*, first touch pads 12*pb*, data pads 12*pc*, second circuit pads 12*pd*, and second touch pads 12*pe*. The first circuit pads 12*pa*, the first touch pads 12*pb*, the data pads 12*pc*, the second circuit pads 12*pd*, and the second touch pads 12*pe* of the pad portion 12 may be arranged in the second direction (e.g., the ±x direction). According to some embodiments, as shown in FIG. 5, each of the first circuit pads 12*pa*, the first touch pads 12*pb*, the data pads 12*pc*, the second circuit pads 12*pd*, and the second touch pads 12*pe* of the pad portion 12 may have a parallelogrammic planar shape.

The first circuit pads 12*pa* may be electrically connected the first circuit driving signal lines CDL1, respectively. The first circuit pads 12*pa* may be configured to transmit a first circuit driving signal Scd1 through the first circuit driving signal lines CDL1. The first circuit driving signal Scd1 may be a signal for driving the pixel circuits PC. The first circuit driving signal Scd1 may include a control signal forming the gate signal, the initialization voltage Vint, and the first driving voltage ELVDD. For example, a first circuit pad 12*pa* may be configured to transmit the control signal to the first gate driver GDU1 through a first circuit driving signal line CDL1. The control signal may include a carry clock signal, a scan clock signal, and a global clock signal. The first circuit pad 12*pa* may be configured to transmit the initialization voltage Vint to the first voltage supply line VL1 through the first circuit driving signal line CDL1. The first circuit pad 12*pa* may be configured to transmit the first driving voltage ELVDD to the driving voltage supply line PVL through the first circuit driving signal line CDL1.

Figure 6:
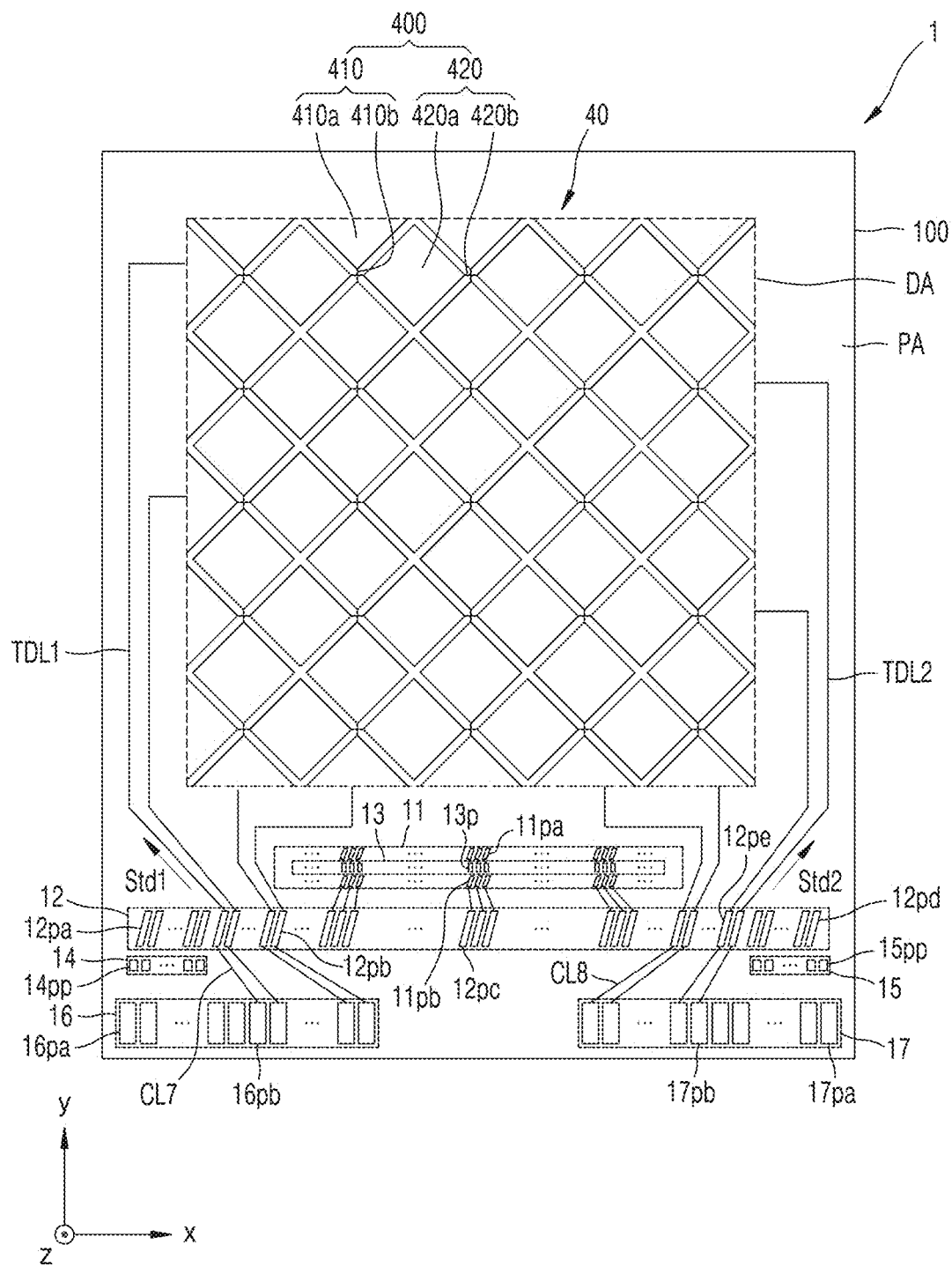
FIG. 6 is a schematic plan view of a display apparatus according to some embodiments.

The first touch pads 12*pb* may be electrically connected to first touch driving signal lines TDL1, respectively, as shown in FIG. 6 to be described below. The first touch pads 12*pb* may be configured to transmit a first touch driving signal Std1 through the first touch driving signal lines TDL1. The first touch driving signal Std1 may be a signal for driving the touch sensing layer 40.

The data pads 12*pc* may be connected to the input pads 11*pb* through second connection lines CL2. A data pad 12*pc* may be configured to transmit information about an image to be realized in the display area DA to an input pad 11*pb* through a second connection line CL2. The driving chip 11 may be configured to output a data voltage to the output pad 11*pa* based on the information input to the input pad 11*pb*.

The second circuit pads 12*pd* may be electrically connected to second circuit driving signal lines CDL2, respectively. The second circuit pads 12*pd* may be configured to transmit a second circuit driving signal Scd2 through the second circuit driving signal lines CDL2. The second circuit driving signal Scd2 may be a signal for driving the pixel circuits PC. The second circuit driving signal Scd2 may include a control signal forming the gate signal, the initialization voltage Vint, and the first driving voltage ELVDD. For example, a second circuit pad 12*pd* may be configured to transmit the control signal to the second gate driver GDU2 through a second circuit driving signal line CDL2. The control signal may include a carry clock signal, a scan clock signal, and a global clock signal. The second circuit pad 12*pd* may be configured to transmit the initialization voltage Vint to the second voltage supply line VL2 through the second circuit driving signal line CDL2. The second circuit pad 12*pd* may be configured to transmit the first driving voltage ELVDD to the driving voltage supply line PVL through the second circuit driving signal lines CDL2.

The second touch pads 12*pe* may be electrically connected to second touch driving signal lines TDL2, respectively, as shown in FIG. 6 to be described below. The second touch pads 12*pe* may be configured to transmit a second touch driving signal Std2 through the second touch driving signal lines TDL2. The second touch driving signal Std2 may be a signal for driving the touch sensing layer 40.

The data test pad portion 13 may be located on one side of the peripheral area PA (e.g., in a portion of the peripheral area PA corresponding to the lower end of the substrate 100). The data test pad portion 13 may include the data test pads 13*p*. The data test pads 13*p* of the data test pad portion 13 may be electrically connected to the data lines DL, respectively. For example, the data test pads 13*p* may be connected to the output pads 11*pa*, respectively. Because the output pads 11*pa* are connected to the data lines DL through the first connection lines CL1, respectively, the data test pads 13*p* may be connected to the data lines DL through the output pads 11*pa* and the first connection lines CL1, respectively. The data test pad portion 13 may be used to test the display apparatus 1. When testing the display apparatus 1, a test data signal (or test data voltage) may be applied to the data test pads 13*p* through the probes (or probe pins). The test data signal may be transmitted from the data test pad portion 13 to the data lines DL via the output pads 11*pa* and the first connection lines CL1.

The first test pad portion 14 may be located on one side of the peripheral area PA (e.g., in a portion of the peripheral area PA corresponding to the lower end of the substrate 100). The first test pad portion 14 may include first circuit test pads 14*pp*. The first circuit test pads 14*pp* may correspond to the first test pads 14*p* of FIG. 4 described above. The first circuit test pads 14*pp* may be arranged in the second direction (e.g., the ±x direction). According to some embodiments, as shown in FIG. 5, each of the first circuit test pads 14*pp* may have a rectangular planar shape. According to some embodiments, a size of each of the first circuit test pads 14*pp* may be greater than a size of each of the data test pads 13*p*. For example, the size of each of the first circuit test pads 14*pp* may be about 3 times to about 7 times the size of each of the data test pads 13*p*.

The first circuit test pads 14*pp* of the first test pad portion 14 may be electrically connected to the first circuit pads 12*pa* of the pad portion 12 through third connection lines CL3, respectively. The first test pad portion 14 may be used to test the pixel circuits PC. When testing the pixel circuits PC, a test circuit driving signal may be applied to the first circuit test pads 14*pp* through the probes. The test circuit driving signal may be transmitted from a first circuit test pad 14*pp* of the first test pad portion 14, via a third connection line CL3 and the first circuit pad 12*pa* of the pad portion 12, to the first gate driver GDU1, the first voltage supply line VL1, and the driving voltage supply line PVL.

The second test pad portion 16 may be located on one side of the peripheral area PA (e.g., in a portion of the peripheral area PA corresponding to the lower end of the substrate 100). The second test pad portion 16 may include second circuit test pads 16*pa* and first touch test pads 16*pb*. The second circuit test pads 16*pa* and the first touch test pads 16*pb* may be arranged in the second direction (e.g., the ±x direction). According to some embodiments, as shown in FIG. 5, each of the second circuit test pads 16*pa* and the first touch test pads 16*pb* may have a rectangular planar shape. According to some embodiments, a size of each of the first circuit test pads 14*pp* may be less than a size of each of the second circuit test pads 16*pa* and the first touch test pads 16*pb*. For example, the size of each of the second circuit test pads 16*pa* and the first touch test pads 16*pb* may be about 10 times to about 15 times the size of each of the first circuit test pads 14*pp*.

The second circuit test pads 16*pa* of the second test pad portion 16 may be electrically connected to the first circuit test pads 14*pp* of the first test pad portion 14 through fourth connection lines CL4, respectively. The fourth connection lines CL4 may radially extend from the first test pad portion 14. The second test pad portion 16 may be used to test the display apparatus 1. The first test pad portion 14 may be used for a test to be performed after only the pixel circuits PC are formed, and the second test pad portion 16 may be used for a test to be performed after the display elements and the touch sensing layer 40 are further formed. When testing the display apparatus 1, a test circuit driving signal may be applied to the second circuit test pads 16*pa* of the second test pad portion 16, and a test touch driving signal may be applied to the first touch test pads 16*pb* of the second test pad portion 16, through the probes. The test circuit driving signal may be transmitted from the second circuit test pads 16*pa* of the second test pad portion 16, via the fourth connection lines CL4, the first circuit test pads 14*pp* of the first test pad portion 14, the third connection lines CL3, and the first circuit pad 12*pa* of the pad portion 12, to the first gate driver GDU1, the first voltage supply line VL1, and the driving voltage supply line PVL. The test touch driving signal may be transmitted from the first touch test pads 16*pb* of the second test pad portion 16, via the first touch pads 12*pb* of the pad portion 12, to the sensing electrode lines 400 of FIG. 6 to be described.

In addition, unlike the first test pad portion 14, the second test pad portion 16 may be used for a test to be performed after the display elements and the touch sensing layer 40, in addition to the pixel circuits PC, are further formed, and thus, the second test pad portion 16 may further include an additional pad, such as a pad to transmit the second driving voltage ELVSS (see FIG. 3).

Also, although FIG. 5 illustrates that the second circuit test pads 16*pa* and the first touch test pads 16*pb* of the second test pad portion 16 are separated from each other, according to some embodiments, the second circuit test pads 16*pa* and the first touch test pads 16*pb* of the second test pad portion 16 may not be separated from each other. For example, at least one first touch test pad 16*pb* may also be between at least some of the second circuit test pads 16*pa*.

The third test pad portion 15 may be located on one side of the peripheral area PA (e.g., in a portion of the peripheral area PA corresponding to the lower end of the substrate 100). The third test pad portion 15 may include third circuit test pads 15*pp*. The third circuit test pads 15*pp* may correspond to the third test pads 15*p* of FIG. 4 described above. The third circuit test pads 15*pp* may be arranged in the second direction (e.g., the ±x direction). According to some embodiments, as shown in FIG. 5, each of the third circuit test pads 15*pp* may have a rectangular planar shape. According to some embodiments, a size of each of the third circuit test pads 15*pp* may be greater than a size of each of the data test pads 13*p*. For example, the size of each of the third circuit test pads 15*pp* may be about 3 times to about 7 times the size of each of the data test pads 13*p*.

The third circuit test pads 15*pp* of the third test pad portion 15 may be electrically connected to the second circuit pads 12*pd* of the pad portion 12 through fifth connection lines CL5, respectively. The third test pad portion 15 may be used to test the pixel circuits PC. When testing the pixel circuits PC, a test circuit driving signal may be applied to the third circuit test pads 15*pp* through the probes. The test circuit driving signal may be transmitted from a third circuit test pad 15*pp* of the third test pad portion 15, via a fifth connection line CL5 and the second circuit pad 12*pd* of the pad portion 12, to the second gate driver GDU2, the second voltage supply line VL2, and the driving voltage supply line PVL.

The fourth test pad portion 17 may be located on one side of the peripheral area PA (e.g., in a portion of the peripheral area PA corresponding to the lower end of the substrate 100). The fourth test pad portion 17 may include fourth circuit test pads 17*pa* and second touch test pads 17*pb*. The fourth circuit test pads 17*pa* and the second touch test pads 17*pb* may be arranged in the second direction (e.g., the ±x direction). According to some embodiments, as shown in FIG. 5, each of the fourth circuit test pads 17*pa* and the second touch test pads 17*pb* may have a rectangular planar shape. According to some embodiments, a size of each of the third circuit test pads 15*pp* may be less than a size of each of the fourth circuit test pads 17*pa* and the second touch test pads 17*pb*. For example, the size of each of the fourth circuit test pads 17*pa* and the second touch test pads 17*pb* may be about 10 times to about 15 times the size of each of the third circuit test pads 15*pp*.

The fourth circuit test pads 17*pa* of the fourth test pad portion 17 may be electrically connected to the third circuit test pads 15*pp* of the third test pad portion 15 through sixth connection lines CL6, respectively. The sixth connection lines CL6 may radially extend from the third test pad portion 15. The fourth test pad portion 17 may be used to test the display apparatus 1. The third test pad portion 15 may be used for a test to be performed after only the pixel circuits PC are formed, and the fourth test pad portion 17 may be used for a test to be performed after the display elements and the touch sensing layer 40 are further formed. When testing the display apparatus 1, a test circuit driving signal may be applied to the fourth circuit test pads 17*pa* of the fourth test pad portion 17, and a test touch driving signal may be applied to the second touch test pads 17*pb* of the fourth test pad portion 17, through the probes. The test circuit driving signal may be transmitted from the fourth circuit test pads 17*pa* of the fourth test pad portion 17, via the sixth connection lines CL6, the third circuit test pads 15*pp* of the third test pad portion 15, the fifth connection lines CL5, and the second circuit pad 12*pd* of the pad portion 12, to the second gate driver GDU2, the second voltage supply line VL2, and the driving voltage supply line PVL. The test touch driving signal may be transmitted from the second touch test pads 17*pb* of the fourth test pad portion 17, via the second touch pads 12*pe* of the pad portion 12, to the sensing electrode lines 400 of FIG. 6 to be described.

In addition, unlike the third test pad portion 15, the fourth test pad portion 17 may be used for a test to be performed after the display elements and the touch sensing layer 40, in addition to the pixel circuits PC, are further formed, and thus, the fourth test pad portion 17 may further include an additional pad, such as a pad to transmit the second driving voltage ELVSS (see FIG. 3).

Also, although FIG. 5 illustrates that the fourth circuit test pads 17*pa* and the second touch test pads 17*pb* of the fourth test pad portion 17 are separated from each other, according to some embodiments, the fourth circuit test pads 17*pa* and the second touch test pads 17*pb* of the fourth test pad portion 17 may not be separated from each other. For example, at least one second touch test pad 17*pb* may also be between at least some of the fourth circuit test pads 17*pa*.

According to some embodiments, the first test pad portion 14 and the third test pad portion 15 may be symmetrical to each other with respect to the data test pad portion 13, and the second test pad portion 16 and the fourth test pad portion 17 may be symmetrical to each other with respect to the data test pad portion 13.

According to some embodiments, the data test pad portion 13, the pad portion 12, the first test pad portion 14, and the second test pad portion 16 may be sequentially arranged in the first direction (e.g., the ±y direction). The pad portion 12 may at least partially overlap the data test pad portion 13 in the first direction (e.g., the ±y direction). The first test pad portion 14 may not overlap the data test pad portion 13 in the first direction (e.g., the ±y direction). The second test pad portion 16 may at least partially overlap the data test pad portion 13 in the first direction (e.g., the ±y direction). Although the description has been provided based on the first test pad portion 14 and the second test pad portion 16, the same description may be applied to the third test pad portion 15 and the fourth test pad portion 17.

As a comparative example, the first test pad portion 14 and the third test pad portion 15 located on one side of the peripheral area PA may be omitted. When the first test pad portion 14 and the third test pad portion 15 are omitted, the data test pad portion 13, the second test pad portion 16, and the fourth test pad portion 17 may be used when testing the pixel circuit PC. The test apparatus for testing the pixel circuit PC may include probes that apply a test signal to the data test pad portion 13, the second test pad portion 16, and the fourth test pad portion 17. The probes of the test apparatus are unable to be physically arranged in parallel (or in two rows) in the first direction (e.g., the ±y direction) due to spatial restrictions, such as an arrangement structure of wires connected to the probes.

Accordingly, data test pads 13p at a region b of the data test pad portion 13 overlapping the second test pad portion 16 in the first direction (e.g., the ±y direction) are not in contact with the probes of the test apparatus. Similarly, data test pads 13p at a region c of the data test pad portion 13 overlapping the fourth test pad portion 17 in the first direction (e.g., the ±y direction) are also not in contact with the probes of the test apparatus. Because the test signal is not applied to the data test pads 13p at the regions b and c, which are not in contact with the probes of the test apparatus, pixel circuits PC connected to data lines DL at regions B and C, which are electrically connected to the data test pads 13p at the regions b and c, are unable to be tested. For example, the pixel circuits PC arranged at a left edge (region B) and a right edge (region C) of the display area DA shown in FIG. 5 are unable to be tested. The left edge (region B) and the right edge (region C) of the display area DA become untestable regions.

However, according to some embodiments, when the first test pad portion 14 and the third test pad portion 15, which do not overlap the data test pad portion 13 in the first direction (e.g., the ±y direction), are arranged, all of the data test pads 13p of the data test pad portion 13 are able to be in contact with the probes of the test apparatus. Accordingly, all of the pixel circuits PC are able to be tested. The left edge (region B) and the right edge (region C) of the display area DA also become testable regions.

FIG. 6 is a schematic plan view of the display apparatus 1 according to some embodiments. For example, FIG. 6 is a schematic plan view of the display apparatus 1 based on the touch sensing layer 40 of FIG. 2 described above. In FIG. 6, the same elements as those in FIG. 4 are denoted by the same reference numerals, and thus, some repeated description thereof may be omitted.

Referring to FIG. 6, the touch sensing layer 40 may include a sensing electrode line 400, and first touch driving signal lines TDL1 and second touch driving signal lines TDL2, which are connected to the sensing electrode line 400. The sensing electrode lines 400 may be arranged in the display area DA, and the first touch driving signal lines TDL1 and the second touch driving signal lines TDL2 may be arranged in the peripheral area PA.

The sensing electrode line 400 may include first sensing electrode lines 410 and second sensing electrode lines 420. A first sensing electrode line 410 may extend in the first direction (e.g., the ±y direction). The first sensing electrode line 410 may include first sensing electrodes 410a and first connection electrodes 410b. The first sensing electrodes 410a may be arranged in the first direction (e.g., the ±y direction). The first connection electrodes 410b may be between the first sensing electrodes 410a. Adjacent first sensing electrodes 410a may be connected to each other through the first connection electrodes 410b. A second sensing electrode line 420 may extend in the second direction (e.g., the ±x direction). The second sensing electrode line 420 may include second sensing electrodes 420a and second connection electrodes 420b. The second sensing electrodes 420a may be arranged in the second direction (e.g., the ±x direction). The second connection electrodes 420b may be between the second sensing electrodes 420a. Adjacent second sensing electrodes 420a may be connected to each other through the second connection electrodes 420b.

The first sensing electrode lines 410 and the second sensing electrode lines 420 may cross each other. For example, as shown in FIG. 6, the first sensing electrode lines 410 and the second sensing electrode lines 420 may vertically cross each other.

Touch sensors may be positioned to correspond to regions where the first sensing electrode lines 410 and the second sensing electrode lines 420 cross each other. A touch sensor may correspond to a region where a first connection electrode 410b of the first sensing electrode line 410 and a second connection electrode 420b of the second sensing electrode line 420 cross each other. In other words, the touch sensor may correspond to a region where the first connection electrode 410b of the first sensing electrode line 410 and the second connection electrode 420b of the second sensing electrode line 420 overlap each other.

The first sensing electrodes 410a of the first sensing electrode line 410 may be respectively positioned over and under (e.g., in a ±y direction) the touch sensor, and the second sensing electrodes 420a of the second sensing electrode line 420 may be respectively positioned on left and right sides (e.g., in a ±x direction) of the touch sensor. The touch sensor may detect whether a touch is made through the first sensing electrodes 410a and the second sensing electrodes 420a, which are positioned around the touch sensor.

The first touch driving signal lines TDL1 may be electrically connected to the first touch pads 12pb of the pad portion 12, respectively. The first touch driving signal lines TDL1 may be configured to transmit the first touch driving signal Std1, which is received from the first touch pads 12pb, to the first sensing electrode lines 410 and the second sensing electrode lines 420. The first touch driving signal Std1 may be a signal for driving the first sensing electrode lines 410 and the second sensing electrode lines 420.

The second touch driving signal lines TDL2 may be electrically connected to the second touch pads 12pe of the pad portion 12, respectively. The second touch driving signal lines TDL2 may be configured to transmit the second touch driving signal Std2, which is received from the second touch pads 12pe, to the first sensing electrode lines 410 and the second sensing electrode lines 420. The second touch driving signal Std2 may be a signal for driving the first sensing electrode lines 410 and the second sensing electrode lines 420.

The first touch test pads 16pb of the second test pad portion 16 may be electrically connected to the first touch pads 12pb of the pad portion 12 through seventh connection lines CL7, respectively. The seventh connection lines CL7 may radially extend from the pad portion 12. When testing the touch sensing layer 40, a test touch driving signal may be applied to the first touch test pads 16pb of the second test pad portion 16 through the probes. The test touch driving signal may be transmitted from the first touch test pads 16pb of the second test pad portion 16, via the seventh connection lines CL7 and the first touch pads 12pb of the pad portion 12, to the sensing electrode lines 400.

The second touch test pads 17pb of the fourth test pad portion 17 may be electrically connected to the second touch pads 12pe of the pad portion 12 through eighth connection lines CL8, respectively. The eighth connection lines CL8 may radially extend from the pad portion 12. When testing the touch sensing layer 40, a test touch driving signal may be applied to the second touch test pads 17pb of the fourth test pad portion 17 through the probes. The test touch driving signal may be transmitted from the second touch test pads 17pb of the fourth test pad portion 17, via the eighth connection lines CL8 and the second touch pads 12pe of the pad portion 12, to the sensing electrode lines 400.

Figure 7:
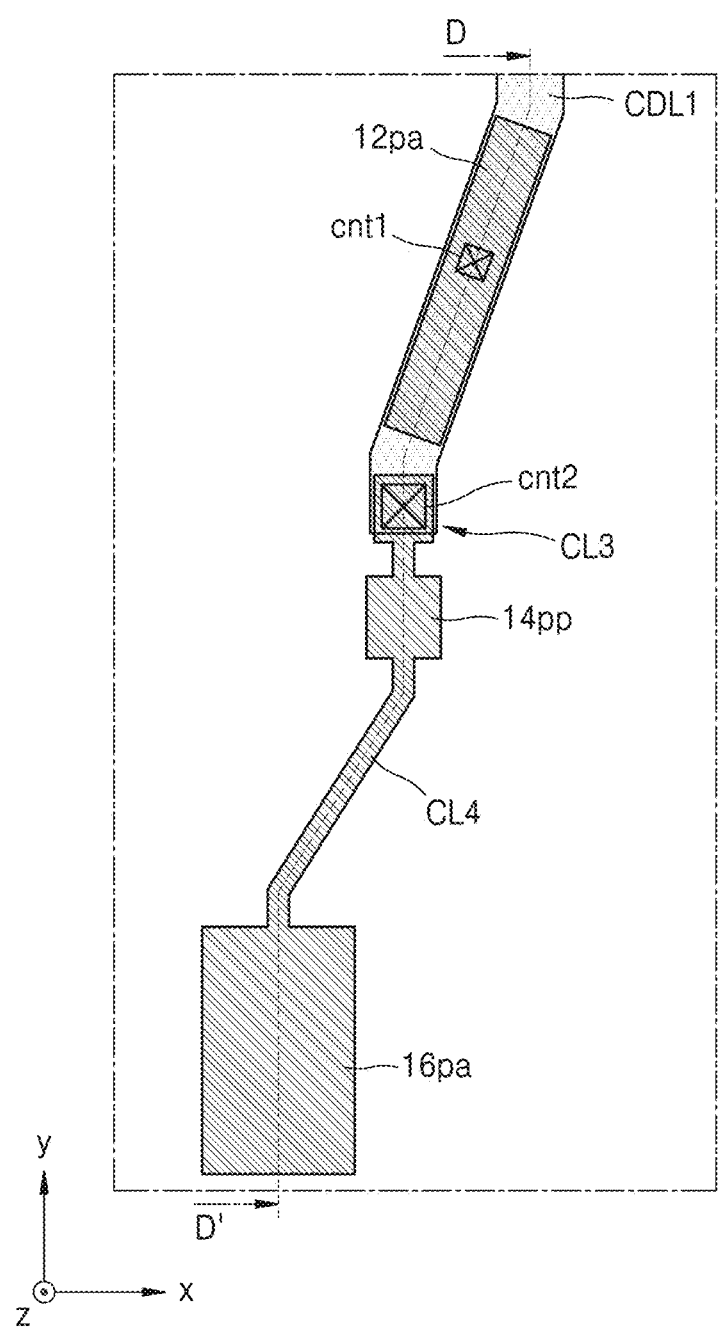
FIG. 7 is a schematic enlarged plan view of a region of a display apparatus according to some embodiments.

FIG. 7 is a schematic enlarged plan view of a region of a display apparatus according to some embodiments. For example, FIG. 7 illustrates the first circuit driving signal line CDL1, the first circuit pad 12pa of the pad portion 12, the third connection line CL3, the first circuit test pad 14pp of the first test pad portion 14, a fourth connection line CL4, and a second circuit test pad 16pa of the second test pad portion 16 of FIG. 5.

Referring to FIG. 7, the first circuit pad 12pa of the pad portion 12 may be connected to the first circuit driving signal line CDL1 through a first contact hole cnt1. The first circuit test pad 14pp of the first test pad portion 14 may be connected to the third connection line CL3 through a second contact hole cnt2.

According to some embodiments, as shown in FIG. 7, a first connection line CL1 and a third connection line CL3 may be integrally formed as a single body. The first circuit test pad 14pp of the first test pad portion 14, the fourth connection line CL4, and the second circuit test pad 16pa of the second test pad portion 16 may be integrally formed as a single body.

According to some embodiments, a size of the first circuit test pad 14pp of the first test pad portion 14 may be less than a size of the second circuit test pad 16pa of the second test pad portion 16. For example, the size of the second circuit test pad 16pa of the second test pad portion 16 may be about 10 times to about 15 times the size of the first circuit test pad 14pp of the first test pad portion 14.

Figure 8:
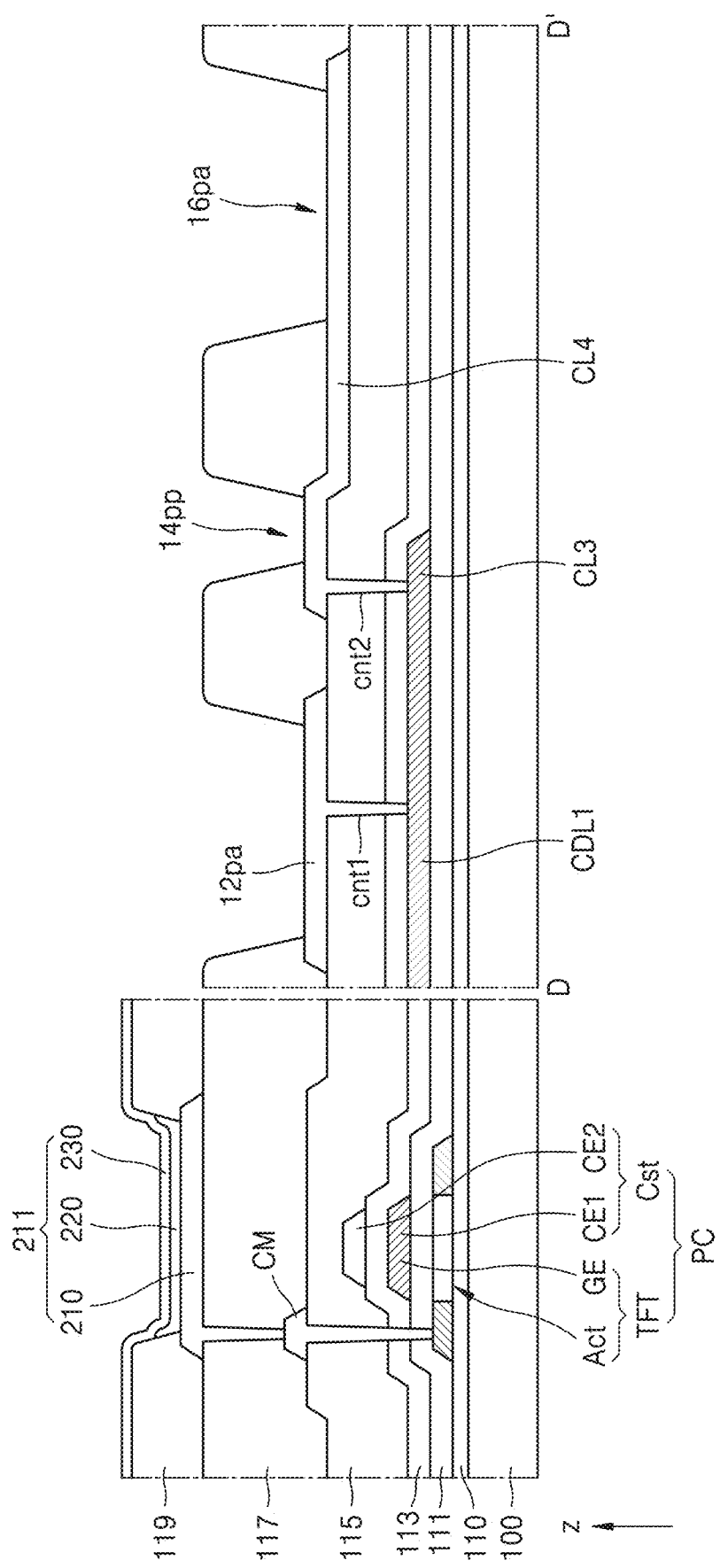
FIG. 8 is a cross-sectional view of a region of the display apparatus of FIG. 7, taken along a line D-D' according to some embodiments.

FIG. 8 is a cross-sectional view of a region of the display apparatus of FIG. 7, taken along a line D-D'. For example, FIG. 8 illustrates a schematic cross-sectional view of the pixel PX (see FIG. 3).

Referring to FIG. 8, the pixel PX may include the pixel circuit PC, and a display element 211 electrically connected to the pixel circuit PC. The pixel circuit PC may include at least one transistor TFT and the storage capacitor Cst. The at least one transistor TFT may include a semiconductor layer Act and a gate electrode GE, and the storage capacitor Cst may include the lower electrode CE1 and the upper electrode CE2. The display element 211 may be an OLED having an anode and a cathode.

Hereinafter, elements and pads included in the pixel PX are described in more detail according to a stacked structure thereof with reference to FIG. 8.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the aforementioned polymer resin and an inorganic layer.

The buffer layer 110 may reduce or block penetration of foreign matter, moisture, or ambient air from the bottom of the substrate 100 and may provide a flat surface on the substrate 100. The buffer layer 110 may include an inorganic material, such as oxide or nitride, an organic material, or a composite of organic/inorganic materials, and may have a single-layered or multi-layered structure including an inorganic material and an organic material.

A barrier layer may be further provided between the substrate 100 and the buffer layer 110. The barrier layer may prevent, reduce, or minimize (or significantly reduce) the penetration of impurities from the substrate 100 and the like into the semiconductor layer Act. The barrier layer may include an inorganic material, such as oxide or nitride, an organic material, or a composite of organic/inorganic materials, and may have a single-layered or multi-layered structure of an inorganic material and an organic material.

The semiconductor layer Act may be located on the buffer layer 110. The semiconductor layer Act may include amorphous silicon or polysilicon. According to some embodiments, the semiconductor layer Act may include oxide of at least one material selected from the group consisting of In, Ga, Sn, Zr, V, Hf, Cd, Ge, Cr, Ti, Al, Cs, Ce, and Zn.

The semiconductor layer Act may include a channel region, and a source region and a drain region, which are arranged at both sides of the channel region, respectively. The semiconductor layer Act may have a single-layered or multi-layered structure.

A first gate insulating layer 111 and a second gate insulating layer 113 may be stacked on the substrate 100 to cover the semiconductor layer Act. Each of the first gate insulating layer 111 and the second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The gate electrode GE, the first circuit driving signal line CDL1, and the third connection line CL3 may be located on the first gate insulating layer 111. The gate electrode GE may at least partially overlap the semiconductor layer Act. Each of the gate electrode GE, the first circuit driving signal line CDL1, and the third connection line CL3 may include molybdenum (Mo), Al, copper (Cu), and Ti, and may have a single-layered or multi-layered structure. As an example, each of the gate electrode GE, the first circuit driving signal line CDL1, and the third connection line CL3 may include a single layer of Mo.

Although FIG. 8 illustrates that the first circuit driving signal line CDL1 and the third connection line CL3 are located on the first gate insulating layer 111, according to some embodiments, the first circuit driving signal line CDL1 and the third connection line CL3 may be located on the second gate insulating layer 113.

According to some embodiments, the storage capacitor Cst may include the lower electrode CE1 and the upper electrode CE2, and may overlap the transistor TFT as shown in FIG. 8. For example, the gate electrode GE of the transistor TFT may function as the lower electrode CE1 of the storage capacitor Cst. Alternatively, the storage capacitor Cst may not overlap the transistor TFT and may be positioned separately from the transistor TFT.

The upper electrode CE2 of the storage capacitor Cst overlaps the lower electrode CE1 with the second gate insulating layer 113 therebetween and forms a capacitance. In this case, the second gate insulating layer 113 may function as a dielectric layer of the storage capacitor Cst.

An interlayer insulating layer 115 may be provided on the second gate insulating layer 113 to cover the upper electrode CE2 of the storage capacitor Cst. The interlayer insulating layer 115 may include $SiO_2$, $SiN_x$, SiON, $Al_2O_3$, $TiO_2$, $Ta_2O_5$, $HfO_2$, or $ZnO_2$.

A connection electrode CM, the first circuit pad 12*pa* of the pad portion 12, the first circuit test pad 14*pp* of the first test pad portion 14, the fourth connection line CL4, and the second circuit test pad 16*pa* of the second test pad portion 16 may be located on the interlayer insulating layer 115. The connection electrode CM, the first circuit pad 12*pa* of the pad portion 12, the first circuit test pad 14*pp* of the first test pad portion 14, the fourth connection line CL4, and the second circuit test pad 16*pa* of the second test pad portion 16 may include a conductive material including Mo, Al, Cu, and Ti, and may have a multi-layered or single-layered structure including the aforementioned material. As an example, the connection electrode CM, the first circuit pad 12*pa* of the pad portion 12, the first circuit test pad 14*pp* of the first test pad portion 14, the fourth connection line CL4, and the second circuit test pad 16*pa* of the second test pad portion 16 may have a multi-layered structure of Ti/Al/Ti.

The connection electrode CM may be connected to the source region or the drain region of the semiconductor layer Act through a contact hole formed in the first gate insulating layer 111, the second gate insulating layer 113, and the interlayer insulating layer 115. The first circuit pad 12*pa* of the pad portion 12 may be connected to the first circuit driving signal lines CDL1 through the first contact hole cnt1 formed in the second gate insulating layer 113 and the interlayer insulating layer 115. The first circuit test pad 14*pp* of the first test pad portion 14 may be connected to the third connection line CL3 through the second contact hole cnt2 formed in the second gate insulating layer 113 and the interlayer insulating layer 115.

The connection electrode CM, the first circuit pad 12*pa* of the pad portion 12, the first circuit test pad 14*pp* of the first test pad portion 14, the fourth connection line CL4, and the second circuit test pad 16*pa* of the second test pad portion 16 may be covered with an inorganic protective layer. The inorganic protective layer may include a single layer or multi-layer of $SiN_x$ and $SiO_x$. The inorganic protective layer may be used to cover and protect some wires arranged over the interlayer insulating layer 115.

A planarization layer 117 may be provided on the interlayer insulating layer 115 to cover the connection electrode CM, the first circuit pad 12*pa* of the pad portion 12, the first circuit test pad 14*pp* of the first test pad portion 14, the fourth connection line CL4, and the second circuit test pad 16*pa* of the second test pad portion 16. The planarization layer 117 may have a single-layered or multi-layered structure including an organic material, and provides a flat upper surface. The planarization layer 117 may include a general-purpose polymer, such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any blend thereof.

The planarization layer 117 may have openings that respectively expose at least portions of the first circuit pad 12*pa* of the pad portion 12, the first circuit test pad 14*pp* of the first test pad portion 14, and the second circuit test pad 16*pa* of the second test pad portion 16.

The display element 211 may be located on the planarization layer 117. The display element 211 may include a pixel electrode 210, an intermediate layer 220 including an organic emission layer, and an opposite electrode 230. The display element 211 may be connected to the transistor TFT of the pixel circuit PC through the connection electrode CM.

The pixel electrode 210 may include a (semi-) transmissive electrode or a reflective electrode. According to some embodiments, the pixel electrode 210 may include a reflective layer including silver (Ag), magnesium (Mg), Al, platinum (Pt), palladium (Pd), gold (Au), nickel (Ni), neodymium (Nd), iridium (Ir), Cr, or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the pixel electrode 210 may include ITO/Ag/ITO.

A pixel-defining layer 119 may be located on the planarization layer 117 in a display area of the substrate 100. The pixel-defining layer 119 may cover an edge of the pixel electrode 210 and may have an opening through which a center portion of the pixel electrode 210 is exposed. An emission area of the display element 211 may be defined by the opening. The pixel-defining layer 119 may prevent or reduce instances of an arc or the like occurring on the edge of the pixel electrode 210 by increasing a distance between the edge of the pixel electrode 210 and the opposite electrode 230 over the pixel electrode 210.

The pixel-defining layer 119 may be formed of at least one organic insulating material selected from the group consisting of polyimide, polyamide, an acrylic resin, benzocyclobutene, and a phenolic resin by using spin coating or the like.

The intermediate layer 220 may be arranged in the opening formed by the pixel-defining layer 119 and may include an organic emission layer. The organic emission layer may include an organic material including a fluorescent or phosphorescent material emitting red, green, blue, or white light. The organic emission layer may be formed of a low molecular weight organic material or a polymer organic material, and functional layers, such as a hole transport layer (HTL), a hole injection layer (HIL), an electron transport layer (ETL), and an electron injection layer (EIL), may selectively be further arranged under and over the organic emission layer.

The opposite electrode 230 may be a transmissive electrode or a reflective electrode. According to some embodiments, the opposite electrode 230 may be a transparent or semi-transparent electrode and may be formed of a metal thin film having a low work function, including lithium (Li), calcium (Ca), lithium fluoride (LiF)/Ca, LiF/Al, Al, Ag, Mg, or a compound thereof. In addition, a transparent conductive oxide (TCO) layer including ITO, IZO, ZnO, or $In_2O_3$ may be further arranged over the metal thin film. The opposite electrode 230 may be arranged over the display area, and may be arranged over the intermediate layer 220 and the pixel-defining layer 119. The opposite electrode 230 may be integrally formed as a single body with a plurality of organic light-emitting diodes OLED to correspond to a plurality of pixel electrodes 210.

Because the organic light-emitting diode OLED is likely damaged by moisture or oxygen from the outside, the encapsulation layer 300 (see FIG. 2) may cover and protect the organic light-emitting diode OLED. The encapsulation layer 300 cover the display area, and may extend to at least a portion of a peripheral area. The encapsulation layer 300 may include a first inorganic encapsulation layer, an organic encapsulation layer, and a second inorganic encapsulation layer. Each of the first inorganic encapsulation layer and the second inorganic encapsulation layer may include at least one inorganic material from among aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include an acryl-based resin, an epoxy-based resin, polyimide, and polyethylene. According to some embodiments, the organic encapsulation layer may include acrylate.

Figure 9:
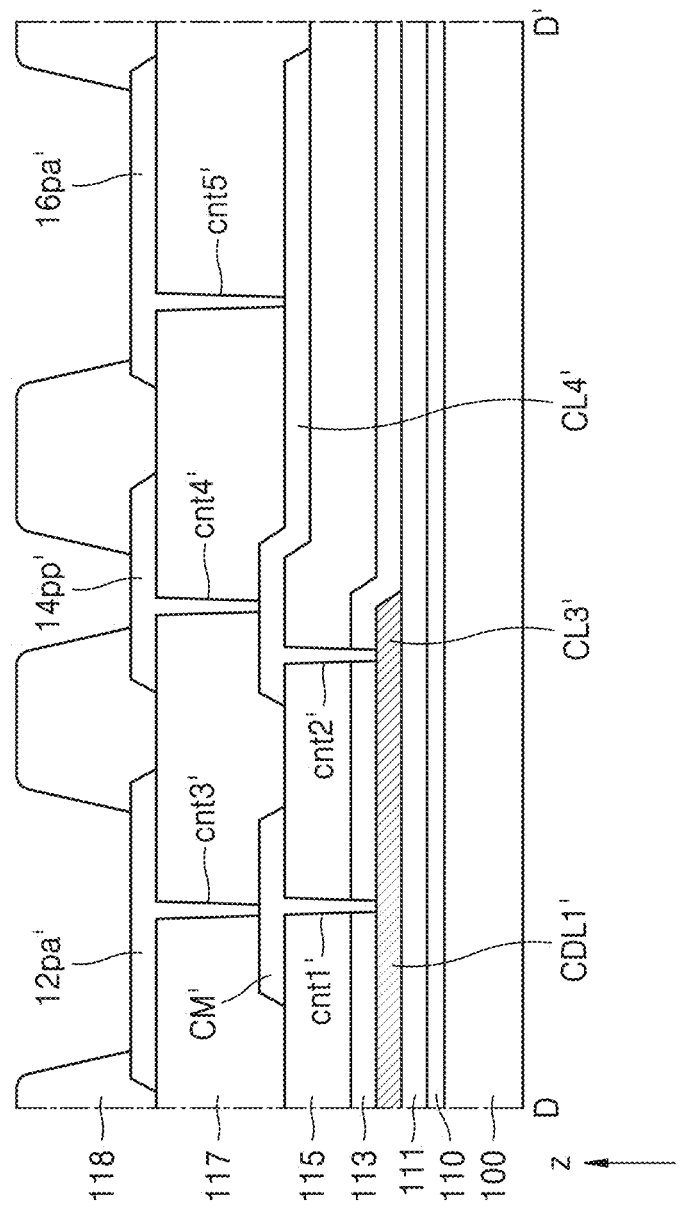
FIG. 9 is a cross-sectional view of a region of the display apparatus of FIG. 7, taken along a line D-D' according to some embodiments.

FIG. 9 is a cross-sectional view of a region of the display apparatus of FIG. 7, taken along a line D-D'. FIG. 9 illustrates further details or modifications of the embodiments illustrated with respect to FIG. 8, and thus, some of the same description as that made with reference to FIG. 8 may not be provided, and differences will be mainly described.

Referring to FIG. 9, a first circuit driving signal line CDL1' and a third connection line CL3' may be located on the first gate insulating layer 111. A connection electrode CM' and a fourth connection line CL4' may be located on the interlayer insulating layer 115. The connection electrode CM' may be connected to the first circuit driving signal line CDL1' through a first contact hole cnt1' formed in the second gate insulating layer 113 and the interlayer insulating layer 115. The fourth connection line CL4' may be connected to the third connection line CL3' through a second contact hole cnt2' formed in the second gate insulating layer 113 and the interlayer insulating layer 115.

A first circuit pad 12pa' of the pad portion 12, a first circuit test pad 14pp' of the first test pad portion 14, and a second circuit test pad 16pa' of the second test pad portion 16 may be located on the planarization layer 117. The first circuit pad 12pa' of the pad portion 12 may be connected to the connection electrode CM' through a third contact hole cnt3' formed in the planarization layer 117. The first circuit test pad 14pp' of the first test pad portion 14 may be connected to the fourth connection line CL4' through a fourth contact hole cnt4' formed in the planarization layer 117. The second circuit test pad 16pa' of the second test pad portion 16 may be connected to the fourth connection line CL4' through a fifth contact hole cnt5' formed in the planarization layer 117.

An insulating layer 118 may be provided over the planarization layer 117 to cover the first circuit pad 12pa' of the pad portion 12, the first circuit test pad 14pp' of the first test pad portion 14, and the second circuit test pad 16pa' of the second test pad portion 16. The insulating layer 118 may include a single layer or multi-layer including an organic material layer and may provide a flat upper surface. The insulating layer 118 may general-purpose polymer, such as BCB, polyimide, HMDSO, PMMA, or PS, a polymer derivative having a phenol-based group, acryl-based polymer, imide-based polymer, aryl ether-based polymer, amide-based polymer, fluorine-based polymer, a p-xylene-based polymer, vinyl alcohol-based polymer, and a blend thereof.

The insulating layer 118 may have openings that respectively expose at least portions of the first circuit pad 12pa' of the pad portion 12, the first circuit test pad 14pp' of the first test pad portion 14, and the second circuit test pad 16pa' of the second test pad portion 16.

In the above, the display apparatus is mainly described, but one or more embodiments are not limited thereto. For example, a method of manufacturing the display apparatus may also be within the scope of the disclosure.

According to one or more embodiments, the display apparatus in which a region where pixel circuit testing is impossible is removed may be implemented. The scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:
1. A display apparatus comprising:
a substrate including a display area and a peripheral area surrounding at least a portion of the display area;
a plurality of pixel circuits in the display area;
a plurality of data lines in the display area, extending in a first direction, and electrically connected to the plurality of pixel circuits;
a plurality of gate lines in the display area, extending in a second direction crossing the first direction, and electrically connected to the plurality of pixel circuits;
a gate driver in the peripheral area, and transmitting a gate signal to the plurality of pixel circuits through the plurality of gate lines;
a data test pad portion in the peripheral area, and including a plurality of data test pads electrically connected to the plurality of data lines, respectively;
a pad portion in the peripheral area, and electrically connected to a printed circuit board;
a plurality of output pads in the peripheral area, and connected to the plurality of data lines, respectively;
a first test pad portion in the peripheral area, and spaced apart from the data test pad portion in the first direction; and
a second test pad portion in the peripheral area, and at least partially overlapping the data test pad portion in the first direction.

2. The display apparatus of claim 1, wherein the plurality of data test pads are connected to the plurality of data lines through the plurality of output pads and a plurality of first connection lines.

3. The display apparatus of claim 2, wherein each of the plurality of first connection lines connects each of the plurality of data lines to a corresponding one of the plurality of output pads.

4. The display apparatus of claim 1, wherein the first test pad portion includes a plurality of first circuit test pads,
wherein the second test pad portion includes a plurality of second circuit test pads, and
wherein a size of each of the plurality of first circuit test pads is less than a size of each of the plurality of second circuit test pads.

5. The display apparatus of claim 4, wherein a size of each of the plurality of second circuit test pads is in a range of 10 times to 15 times a size of each of the plurality of first circuit test pads.

6. The display apparatus of claim 4, wherein the pad portion includes a plurality of first circuit pads, and
wherein the plurality of first circuit test pads are electrically connected to the plurality of first circuit pads, respectively.

7. The display apparatus of claim 6, wherein the plurality of second circuit test pads are connected to the gate driver through the plurality of first circuit test pads and the plurality of first circuit pads.

\* \* \* \* \*